US009754797B2

(12) United States Patent
Watanabe et al.

(10) Patent No.: US 9,754,797 B2
(45) Date of Patent: Sep. 5, 2017

(54) ETCHING METHOD FOR SELECTIVELY ETCHING SILICON OXIDE WITH RESPECT TO SILICON NITRIDE

(71) Applicant: TOKYO ELECTRON LIMITED, Tokyo (JP)

(72) Inventors: Hikaru Watanabe, Miyagi (JP); Akihiro Tsuji, Miyagi (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 0 days.

(21) Appl. No.: 14/995,269

(22) Filed: Jan. 14, 2016

(65) Prior Publication Data
US 2016/0211148 A1 Jul. 21, 2016

(30) Foreign Application Priority Data

Jan. 16, 2015 (JP) .................. 2015-006769
Dec. 3, 2015 (JP) .................. 2015-236609

(51) Int. Cl.
*H01L 21/302* (2006.01)
*H01L 21/311* (2006.01)
*H01L 21/02* (2006.01)

(52) U.S. Cl.
CPC .... *H01L 21/31116* (2013.01); *H01L 21/0212* (2013.01); *H01L 21/02274* (2013.01)

(58) Field of Classification Search
CPC .............. H01L 21/31; H01L 21/31116; H01L 21/0212; H01L 21/02274; H01L 21/768; H01L 21/28; H01L 21/3065

USPC ................ 438/689–695, 723, 738, 743, 744; 216/37, 67, 72
See application file for complete search history.

(56) References Cited

U.S. PATENT DOCUMENTS 6,174,451 B1 * 1/2001 Hung ................ H01L 21/31116
216/67
7,708,859 B2   5/2010 Huang et al.

FOREIGN PATENT DOCUMENTS

JP        2000-307001 A     11/2000

* cited by examiner

*Primary Examiner* — Binh X Tran
(74) *Attorney, Agent, or Firm* — Rothwell, Figg, Ernst & Manbeck, P.C.

(57) ABSTRACT

An etching method is provided for selectively etching a first region of silicon oxide with respect to a second region of silicon nitride. The target object includes the second region, the first region and a mask. The etching method includes a first sequence and a second sequence. Each of sequence includes, a first step of generating a plasma of a processing gas containing a fluorocarbon gas in a processing chamber where the target object is accommodated and forming a deposit containing fluorocarbon on the target object, and a second step of etching the first region by radicals of fluorocarbon contained in the deposit. The first sequence is performed during a period including time when the second region is exposed, and an etching amount of the first region in the first sequence is smaller than an etching amount of the first region in the second sequence.

13 Claims, 29 Drawing Sheets

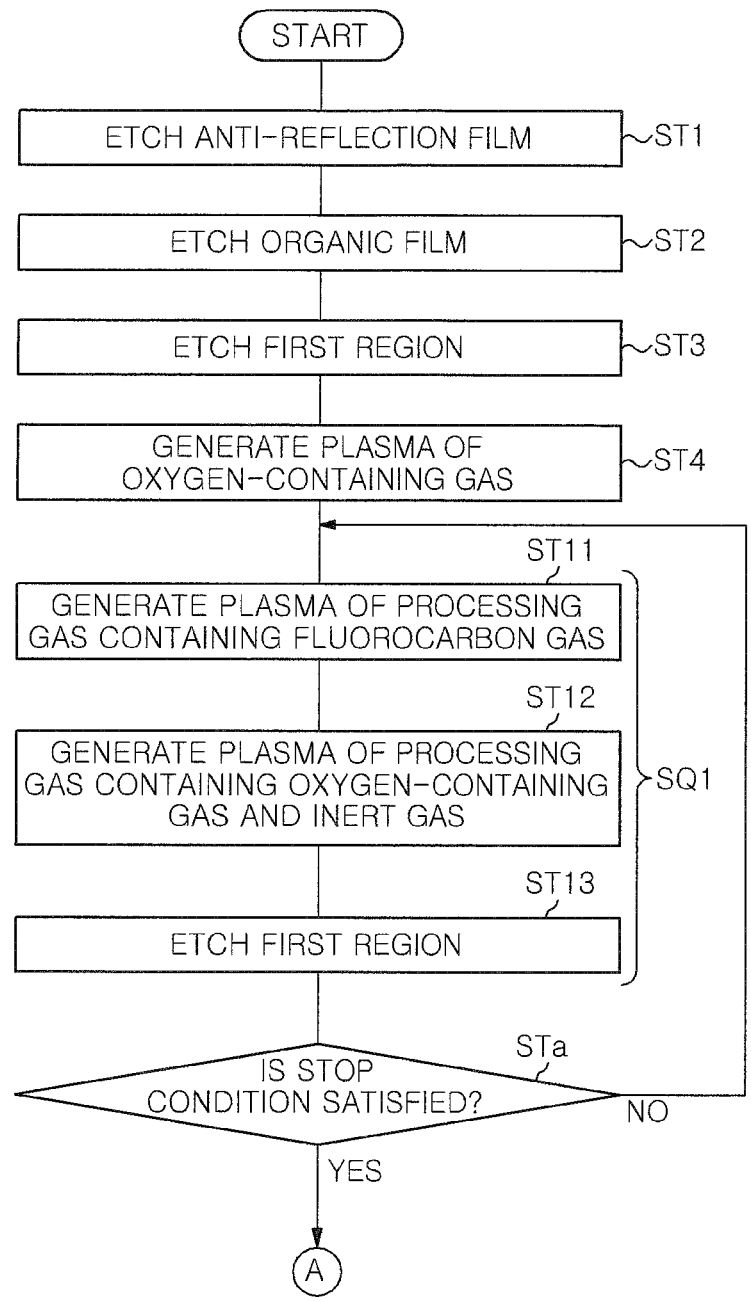

ETCHING METHOD FOR SELECTIVELY ETCHING SILICON OXIDE WITH RESPECT TO SILICON NITRIDE

CROSS-REFERENCE TO RELATED APPLICATIONS

This application claims priority to Japanese Patent Application No. 2015-006769 filed on Jan. 16, 2015 and Japanese Patent Application No. 2015-236609 filed on Dec. 3, 2015, the entire contents of which are incorporated herein by reference.

FIELD OF THE INVENTION

The disclosure relates to an etching method, and more particularly, to a method for selectively etching a first region of silicon oxide with respect to a second region of silicon nitride by performing plasma processing on a target object.

BACKGROUND OF THE INVENTION

In manufacturing electronic devices, there is performed a process of forming an opening such as a hole or a trench at a region of silicon oxide ($SiO_2$). In such a process, a target object is exposed to a plasma of a fluorocarbon gas and then, the region of silicon oxide is etched, as disclosed in U.S. Pat. No. 7,708,859.

There is known a technique for selectively etching a first region of silicon oxide with respect to a second region of silicon nitride. A SAC (Self-Aligned Contact) technique disclosed in Japanese Patent Application Publication No. 2000-307001 is known as an example of such a technique.

The target object to be processed by the SAC technique includes a first region of silicon oxide, a second region of silicon nitride, and a mask. The second region is formed to have a recess. The first region is formed to fill the recess and cover the second region. The mask is provided on the first region and has an opening provided over the recess. As disclosed in Japanese Patent Application Publication No. 2000-307001, in the conventional SAC technique, a plasma of a processing gas containing a fluorocarbon gas, an oxygen gas and an rare gas is used to etch the first region. By exposing the target object to the plasma of the processing gas, a portion of the first region which is exposed through the opening of the mask is etched. As a consequence, an upper opening is formed. Further, by exposing the target object to the plasma of the processing gas, a portion surrounded by the second region, i.e., the first region in the recess, is etched in a self-aligned manner. Accordingly, a lower opening continuous to the upper opening is formed in a self-aligned manner.

In the above conventional technique, at a time when the second region is exposed in the course of etching the first region, there occurs a state where a film for protecting the second region is not formed on a surface of the second region. Thus, if etching of the first region is performed in this state, a portion of the second region is also etched.

In view of the above, the disclosure provides an etching method for etching the first region of silicon oxide while suppressing etching of the second region of silicon nitride.

SUMMARY OF THE INVENTION

In accordance with an aspect of the disclosure, there is provided an etching method for selectively etching a first region of silicon oxide with respect to a second region of silicon nitride by performing plasma processing on a target object. The target object includes the second region forming a recess, the first region that fills the recess and covers the second region, and a mask that is formed on the first region and provides, above the recess, an opening having a width greater than a width of the recess. The etching method includes a first sequence which is performed one or more times to etch the first region, and a second sequence which is performed one or more times, after the first sequence has been performed one or more times, to further etch the first region. Each of the first sequence and the second sequence includes, a first step of generating a plasma of a processing gas containing a fluorocarbon gas in a processing chamber where the target object is accommodated and forming a deposit containing fluorocarbon on the target object, and a second step of etching the first region by radicals of fluorocarbon contained in the deposit. In the etch method, the first sequence is performed during a period including time when the second region is exposed, and an etching amount of the first region in the first sequence is smaller than an etching amount of the first region in the second sequence.

BRIEF DESCRIPTION OF THE DRAWINGS

The objects and features of the disclosure will become apparent from the following description of embodiments, given in conjunction with the accompanying drawings, in which:

FIG. 1A and FIG. 1B are a flowchart of an etching method according to an embodiment;

DETAILED DESCRIPTION OF THE EMBODIMENTS

Figure 1B:
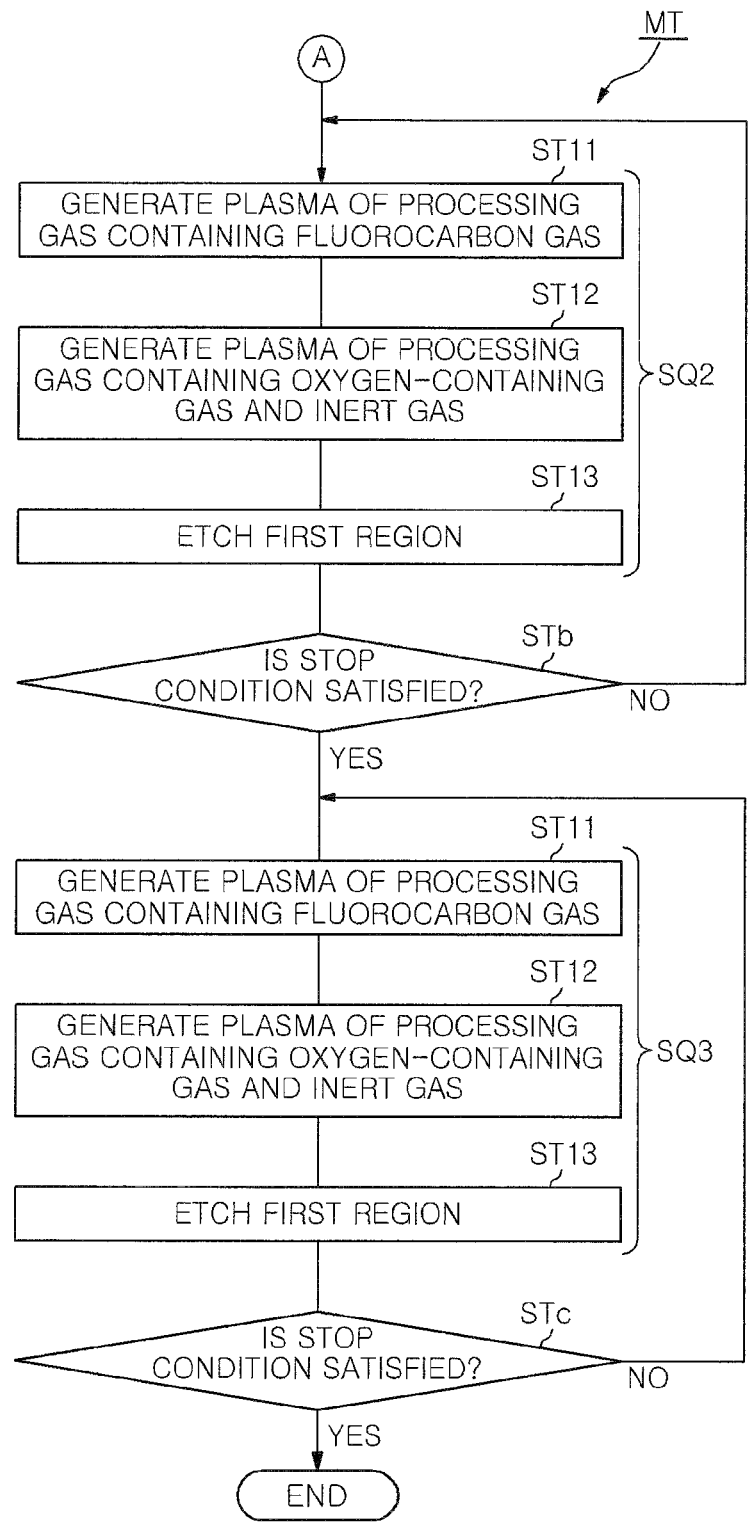

Hereinafter, embodiments will be described with reference to the accompanying drawings. Like reference numerals will be used for like parts throughout the drawings.

FIG. 1A and FIG. 1B are a flowchart of an etching method according to an embodiment. A method MT shown in FIG. 1A and FIG. 1B is an etching method for selectively etching a first region of silicon oxide with respect to a second region of silicon nitride by performing plasma processing on a target object.

Figure 2:
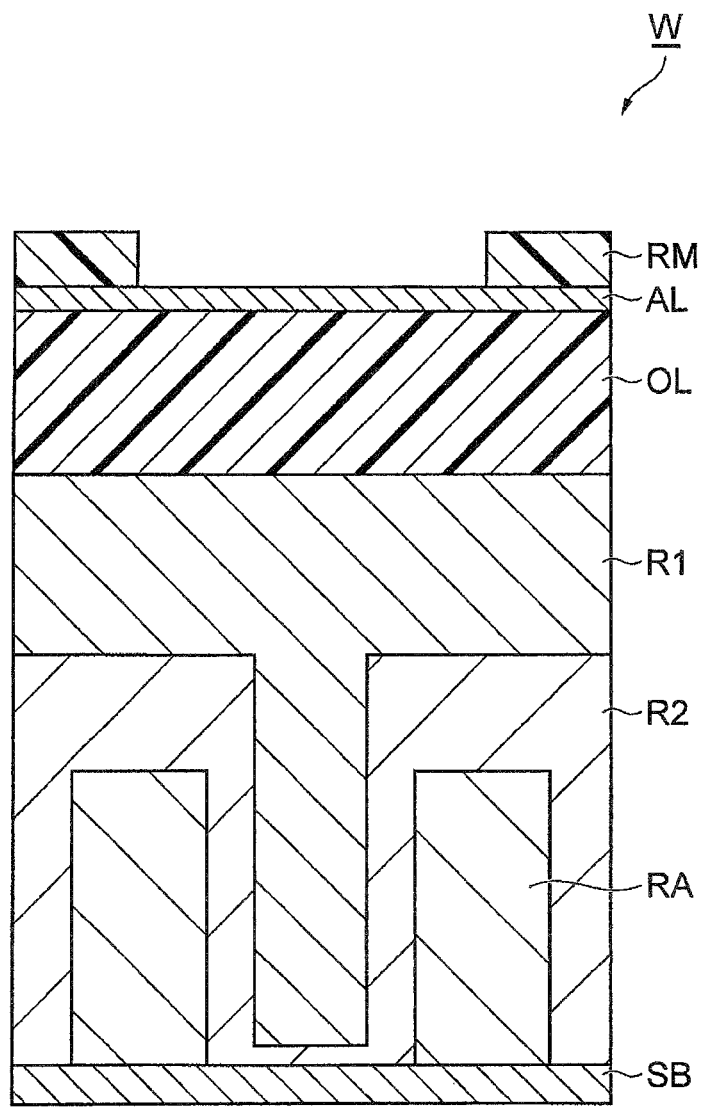
FIG. 2 is a cross sectional view showing an example of a target object to which the etching method according to the embodiment is applied.

FIG. 2 is a cross sectional view showing an example of a target object to which the etching method according to the embodiment is applied. Before the method MT is applied, the target object, i.e., a wafer W, includes a substrate SB, a first region R1, a second region R2, and an organic film OL that will become a mask later, as shown in FIG. 2. For example, this wafer W is obtained during the manufacturing process of a fin-type field effect transistor and further includes a protruding region RA, a silicon-containing anti-reflection film AL, and a resist mask RM.

The protruding region RA protrudes from the substrate SB. The protruding region RA may serve as, e.g., a gate region. The second region R2 is made of silicon nitride ($Si_3N_4$) and formed on surfaces of the protruding region RA and the substrate SB. As shown in FIG. 2, the second region R2 extends to form a recess. For example, the recess has a depth of about 150 nm and a width of about 20 nm.

The first region R1 is made of silicon oxide ($SiO_2$) and formed on the second region R2. Specifically, the first region R1 fills the recess formed by the second region R2 and covers the second region R2.

The organic film OL is formed on the first region R1. The organic film OL may be made of an organic material, e.g., amorphous carbon. The anti-reflection film AL is formed on the organic film OL. The resist mask RM is formed on the anti-reflection film AL. The resist mask RM provides an opening having a width greater than that of the recess formed by the second region R2. The opening of the resist mask RM has a width of, e.g., about 60 nm. A pattern of the resist mask RM is formed by a photolithography technique.

Figure 3:
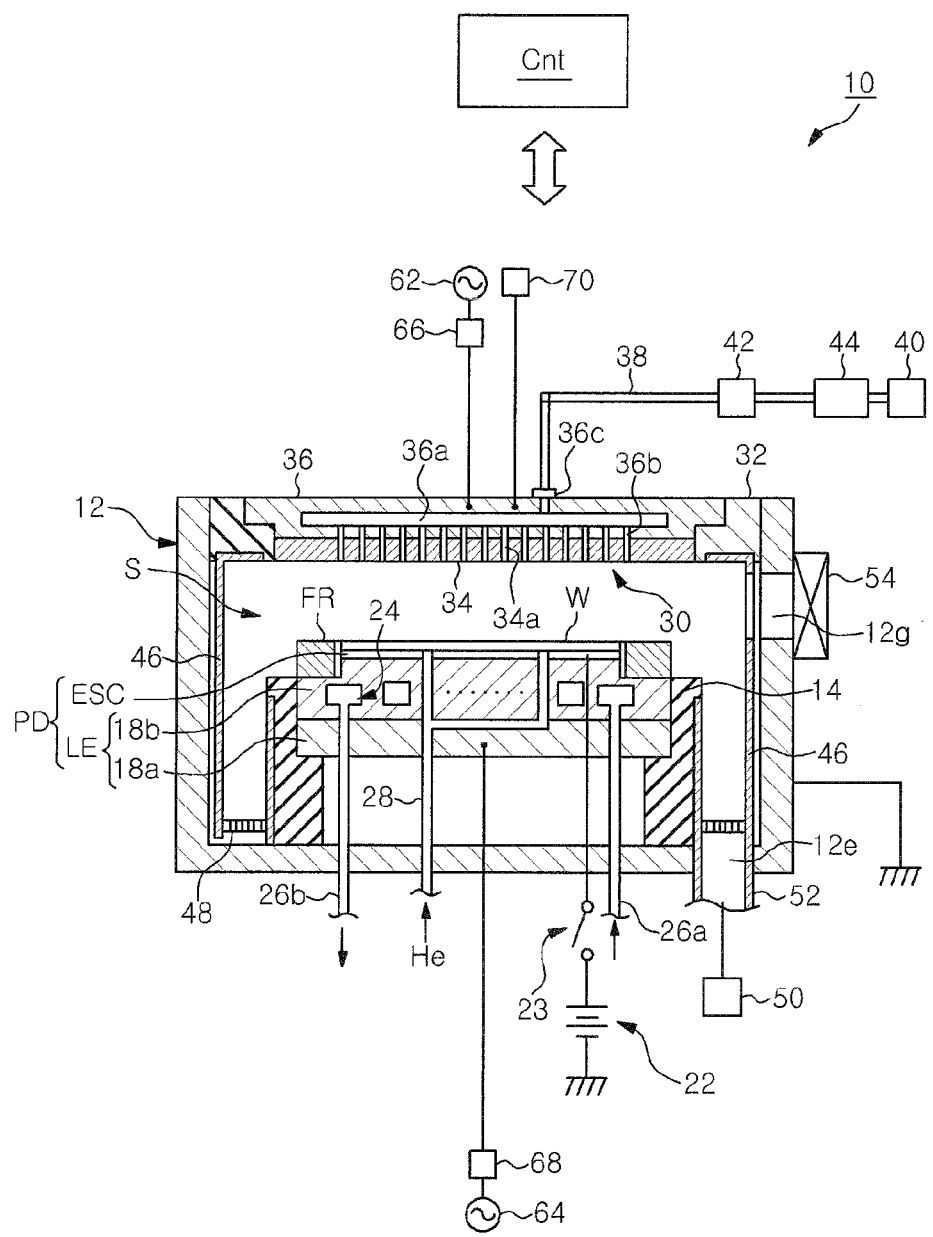
FIG. 3 schematically shows an example of a plasma processing apparatus capable of performing the method according to the embodiment.
Figure 4:
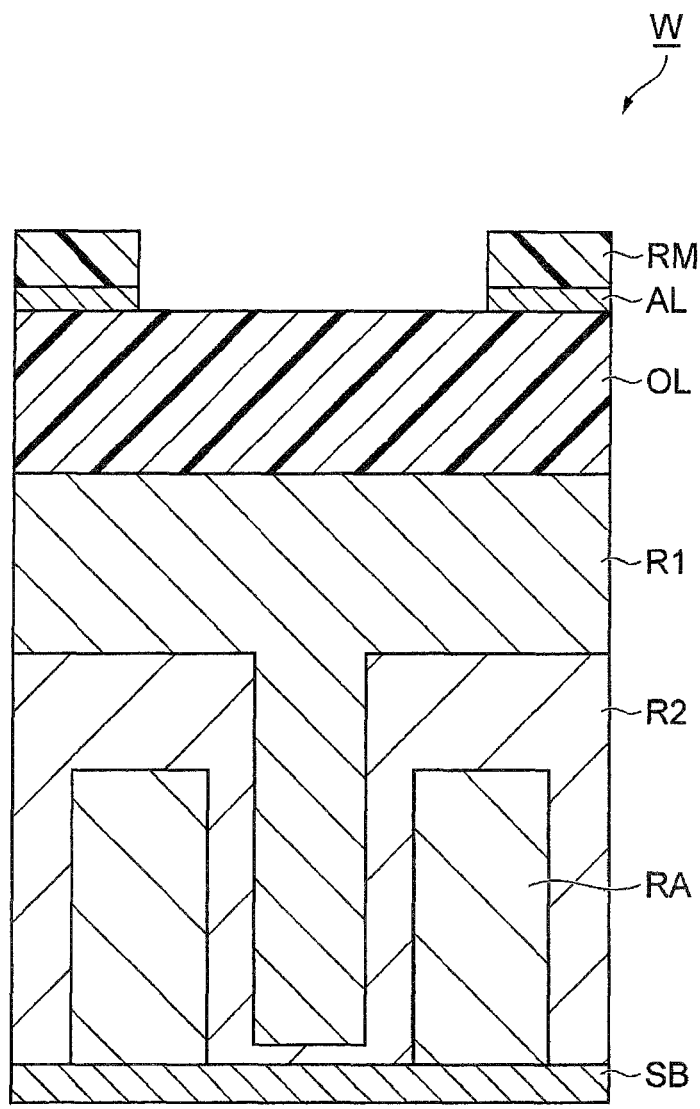
FIGS. 4 to 16 are cross sectional views showing the target object in respective steps of the etching method shown in FIG. 1A and FIG. 1B.
Figure 5:
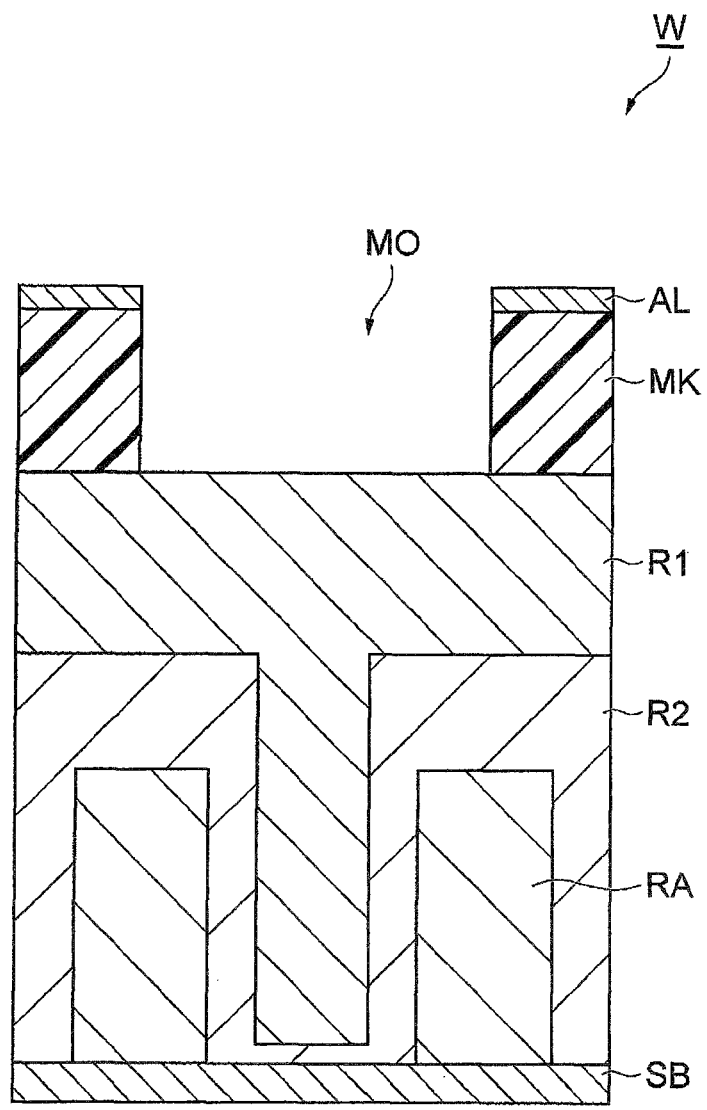
Figure 6:
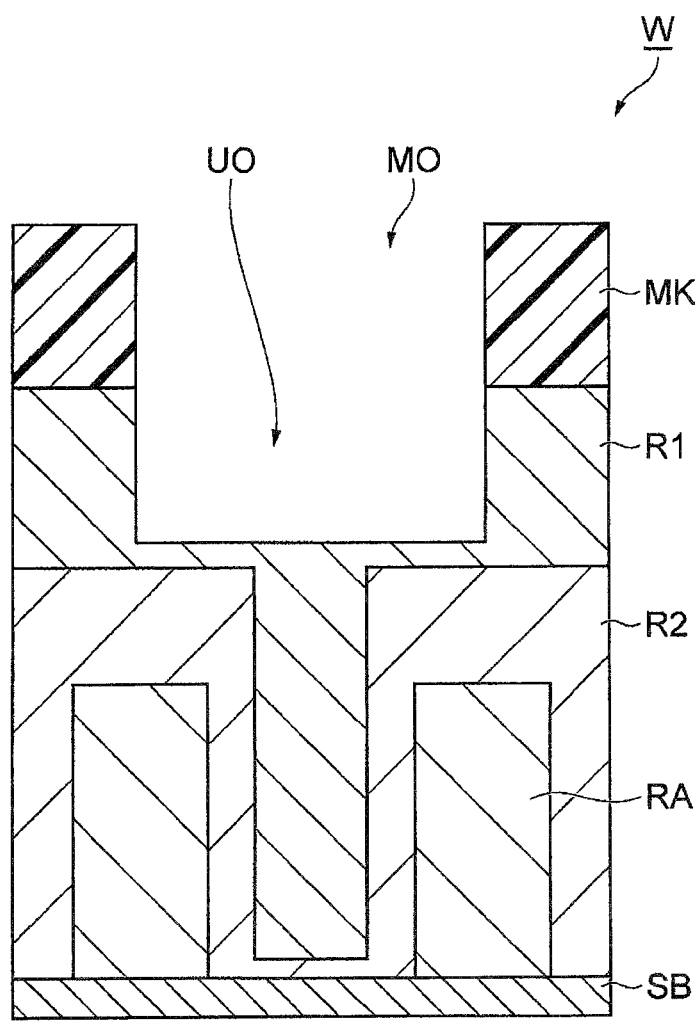
Figure 7:
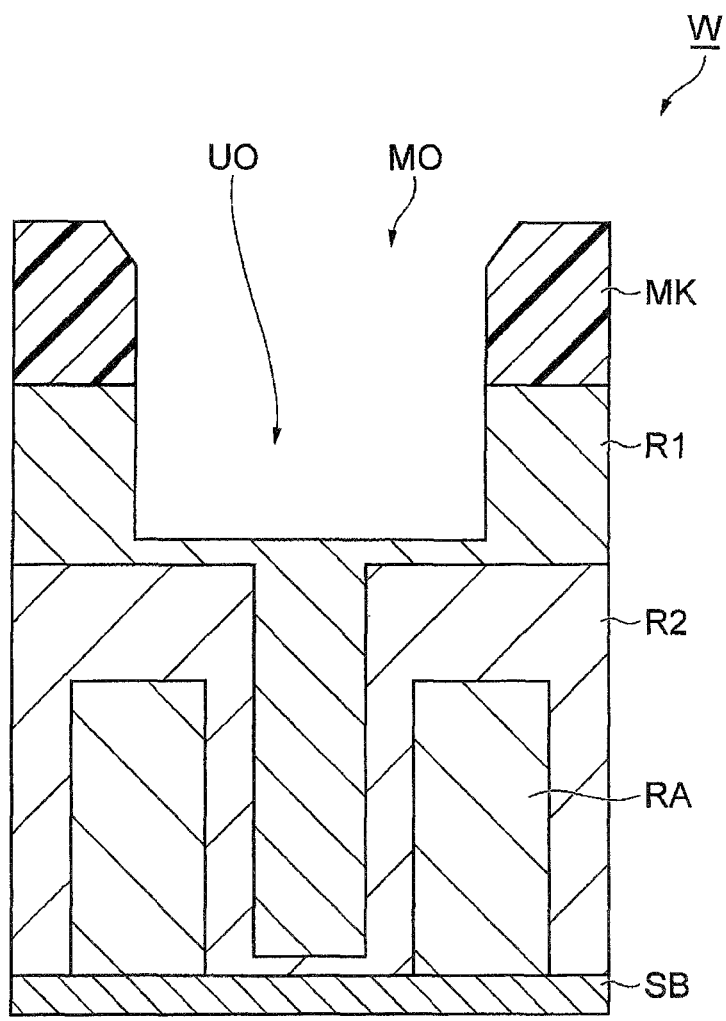

In the method MT, the target object such as the wafer W shown in FIG. 2 is processed in a plasma processing apparatus. FIG. 3 schematically shows an example of a plasma processing apparatus capable of performing the method according to the embodiment. A plasma processing apparatus 10 shown in FIG. 3 is configured as a capacitively coupled plasma etching apparatus and includes a substantially cylindrical processing chamber 12. An inner wall surface of the processing chamber 12 is made of, e.g., anodized aluminum. The processing chamber 12 is frame-grounded.

A substantially cylindrical supporting part 14 is provided at a bottom portion of the processing chamber 12. The supporting part 14 is made of, e.g., an insulating material. In the processing chamber 12, the supporting part extends vertically from the bottom portion of the processing chamber 12. Further, in the processing chamber 12, a mounting table PD is provided. The mounting table PD is supported by the supporting part 14.

The wafer W is held on a top surface of the mounting table PD. The mounting table PD includes a lower electrode LE and an electrostatic chuck ESC. The lower electrode LE has a first plate 18a and a second plate 18b. The first plate 18a and the second plate 18b are made of a metal, e.g., aluminum, and have a substantially disc shape. The second plate 18b is provided on the first plate 18a and electrically connected to the first plate 18a.

An electrostatic chuck ESC is provided on the second plate 18b. The electrostatic chuck ESC has a structure in which an electrode made of a conductive film is interposed between two insulating layers or two insulating sheets. A DC power supply 22 is electrically connected to the electrode of the electrostatic chuck ESC through a switch 23. The wafer W is attracted and held on the electrostatic chuck ESC by an electrostatic force such as a Coulomb force or the like generated by a DC voltage applied from the DC power supply 22.

A focus ring FR is provided on a peripheral portion of the second plate 18b to surround an edge of the wafer W and the electrostatic chuck ESC. The focus ring FR is provided to improve uniformity of etching. The focus ring FR is made of a material that is appropriately selected depending on a material of an etching target film. For example, the focus ring FR may be made of quartz.

A coolant path 24 is provided in the second plate 18b. The coolant path 24 constitutes a temperature control mechanism. A coolant is supplied to the coolant path 24 from an external chiller unit through a line 26a. The coolant flowing in the coolant path 24 returns to the chiller unit through a line 26b. The coolant circulates between the coolant path 24 and the chiller unit. A temperature of the wafer W held on the electrostatic chuck ESC is controlled by controlling a temperature of the coolant.

The plasma processing apparatus 10 further includes a gas supply line 28. A heat transfer gas supply unit (not shown) supplies a heat transfer gas, e.g., He gas to a gap between a top surface of the electrostatic chuck ESC and a backside of the wafer W through the gas supply line 28.

The plasma processing apparatus 10 further includes an upper electrode 30. The upper electrode 30 is provided above the mounting table PD to face the mounting table PD. The upper electrode 30 and the lower electrode LE are approximately parallel to each other. Between the upper electrode 30 and the lower electrode LE, a processing space S where plasma processing is performed on the wafer W is defined.

The upper electrode 30 is held at an upper portion of the processing chamber 12 through an insulating shield member 32. In the present embodiment, the upper electrode 30 may be configured such that a vertical distance from a top surface of the mounting table PD, i.e., a wafer mounting surface, to the upper electrode 30 is variable. The upper electrode 30 may include an electrode plate 34 and an electrode plate holder 36. The electrode plate 34 is in contact with the space S and has a plurality of gas injection openings 34a. In the present embodiment, the electrode plate 34 is made of silicon.

The electrode plate holder 36 detachably holds the electrode plate 34 and is made of a conductive material, e.g., aluminum. The electrode plate holder 36 may have a water cooling structure. A gas diffusion space 36a is provided in the electrode plate holder 36. A plurality of gas holes 36b communicating with the gas injection openings 34a extends downward from the gas diffusion space 36a. Further, the electrode plate holder 36 includes a gas inlet port 36c for guiding a processing gas into the gas diffusion space 36a. A gas supply line 38 is connected to the gas inlet port 36c.

The gas supply line 38 is connected to a gas source group 40 through a valve group 42 and a flow rate controller group 44. The gas source group 40 includes a plurality of gas sources. In this example, the gas source group 40 includes one or more fluorocarbon gas sources, a rare gas source, a nitrogen gas ($N_2$ gas) source, a hydrogen gas ($H_2$ gas) source, and an oxygen-containing gas source. One or more fluorocarbon gas sources may include a $C_4F_8$ gas source, a $CF_4$ gas source, and a $C_4F_6$ gas source. The rare gas source may be a source of any rare gas such as He gas, Ne gas, Ar gas, Kr gas, Xe gas or the like. In this example, the rare gas source may be an Ar gas source. In this example, the oxygen-containing gas source may be an oxygen gas ($O_2$ gas) source. The oxygen-containing gas may also be any gas containing oxygen, e.g., a carbon oxide gas such as CO gas or $CO_2$ gas.

The valve group 42 includes a plurality of valves. The flow rate controller group 44 includes a plurality of flow rate controllers such as a mass flow rate controller and the like. The gas sources of the gas source group 40 are connected to the gas supply line 38 through corresponding valves of the valve group 42 and corresponding flow rate controllers of the flow rate controller group 33, respectively.

In the plasma processing apparatus 10, a deposition shield 46 is detachably provided along the inner wall of the processing chamber 12. The deposition shield 46 is also provided at an outer periphery of the supporting part 14. The deposition shield 46 prevents an etching by-product (deposit) from being adhered to the processing chamber 12. The deposition shield 46 may be made of aluminum coated with ceramic such as $Y_2O_3$ or the like.

A gas exhaust plate 48 is provided at a lower portion in the processing chamber 12 and between the supporting part 14 and the sidewall of the processing chamber 12. The gas exhaust plate 48 may be formed by coating aluminum with ceramic, e.g., $Y_2O_3$ or the like. The gas exhaust plate 48 has a plurality of through holes. In the processing chamber 12, a gas exhaust port 12e is provided below the gas exhaust plate 48. A gas exhaust unit 50 is connected to the gas exhaust port 12e through a gas exhaust line 52. The gas exhaust unit 50 has a vacuum pump such as a turbo molecular pump or the like, and can depressurize the space in the processing chamber 12 to a predetermined vacuum level. A loading/unloading port 12g for the wafer W is provided at the sidewall of the processing chamber 12. The loading/unloading port 12g can be opened and closed by a gate valve 54.

The plasma processing apparatus 10 further includes a first high frequency power supply 62 and a second high frequency power supply 64. The first high frequency power supply 62 generates a high frequency power for plasma generation, e.g., a high frequency power having a frequency in a range from 27 MHz to 100 MHz. The first high frequency power supply 62 is connected to the upper electrode 30 through a matching unit 66. The matching unit 66 has a circuit for matching an output impedance of the first high frequency power supply 62 with an input impedance of the load side (the upper electrode 30 side). The first high frequency power supply 62 may be connected to the lower electrode LE through the matching unit 66.

The second high frequency power supply 64 generates a high frequency bias power for ion attraction to the wafer W, e.g., a high frequency bias power having a frequency in a range from 400 kHz to 13.56 MHz. The second high frequency power supply 64 is connected to the lower electrode LE through a matching unit 68. The matching unit 68 has a circuit for matching an output impedance of the second high frequency power supply 64 with an input impedance of the load side (the lower electrode LE side).

The plasma processing apparatus 10 further includes a power supply 70. The power supply 70 is connected to the upper electrode 30. The power supply 70 applies to the upper electrode 30 a voltage for attracting positive ions in the processing space S to the electrode plate 34. In this example, the power supply 70 is a DC power supply for generating a negative DC voltage. In another example, the power supply 70 may be an AC power supply for generating an AC voltage having a relatively low frequency. The voltage applied from the power supply 70 to the upper electrode 30 may be lower than or equal to −150V. In other words, the voltage applied from the power supply 70 to the upper electrode 30 may be a negative voltage having an absolute value of 150V or above. When such a voltage is applied from the power supply 70 to the upper electrode 30, the positive ions in the processing space S collide with the electrode plate 34. Accordingly, secondary electrons and/or silicon are emitted from the electrode plate 34. The emitted silicon is combined with active species of fluorine in the processing space S, so that the amount of active species of fluorine is decreased.

In the present embodiment, the plasma processing apparatus 10 may further include a control unit Cnt. The control unit Cnt is a computer including a processor, a storage unit, an input device, a display device and the like. The control unit Cnt controls the respective components of the plasma processing apparatus 10. The control unit Cnt can allow an operator to input commands to manage the plasma processing apparatus 10 by using the input device and display the operation state of the plasma processing apparatus 10 on the display device. The storage unit of the control unit Cnt stores therein a control program for allow ing the processor to control various processes performed in the plasma processing apparatus 10, and a program, i.e., a processing recipe, for instructing the respective components of the plasma processing apparatus 10 to perform processes based on the processing conditions.

Referring back to FIG. 1A and FIG. 1B, the method MT1 will be described in detail. FIGS. 2 and 4 to 16 will be appropriately referred to in the following description. FIGS. 4 to 16 are cross sectional views showing the target object in respective steps of the method MT. In the following description, there will be described an example in which the wafer W shown in FIG. 2 is processed by the plasma processing apparatus 10 shown in FIG. 3 according to the method MT.

In the method MT, first, the wafer W shown in FIG. 2 is loaded into the plasma processing apparatus 10 and then mounted and held on the mounting table PD.

Next, a step ST1 of the method MT1 is executed. In the step ST1, the anti-reflection film AL is etched. To do so, a processing gas is supplied into the processing chamber 12 from gas sources selected among the gas sources of the gas source group 40. This processing gas used in the step ST1 contains a fluorocarbon gas. The fluorocarbon gas may include, e.g., at least either one of $C_4F_8$ gas and $CF_4$ gas. The processing gas may further contain a rare gas, e.g., Ar gas. In the step ST1, a pressure in the processing chamber 12 is set to a predetermined level by the operation of the gas exhaust unit 50. In the step ST1, the high frequency power from the first high frequency power supply 62 is supplied to the upper electrode 30 and the high frequency bias power from the second high frequency power supply 64 is supplied to the lower electrode LE.

The step ST1 is executed under the following condition.

Pressure in processing chamber: 10 mTorr (1.33 Pa) to 50 mTorr (6.65 Pa)

Processing gas $C_4F_8$ gas: 10 sccm to 30 sccm $CF_4$ gas: 150 sccm to 300 sccm Ar gas: 200 sccm to 500 sccm High frequency power for plasma generation: 300 W to 1000 W High frequency bias power: 200 W to 500 W In the step ST1, the plasma of the processing gas is generated and a portion of the anti-reflection film AL which is exposed through the opening of the resist mask RM is etched by active species of fluorocarbon. As a result, the portion of the anti-reflection film AL which is exposed through the opening of the resist mask RM is removed as can be seen from FIG. 4. In other words, a pattern of the resist mask RM is transferred onto the anti-reflection film AL and the anti-reflection film AL is formed to have a pattern providing an opening. In the step ST1, the operation of each component of the plasma processing apparatus 10 can be controlled by the control unit Cnt.

Next, in a step ST2, the organic film OL is etched. To do so, a processing gas is supplied into the processing chamber 12 from gas sources selected among the gas sources of the gas source group 40. This processing gas used in the step ST2 may contain a hydrogen gas and nitrogen gas. Moreover, the processing gas used in the step ST2 may contain another gas, e.g., oxygen gas, as long as it can etch the organic film. In the step ST2, a pressure in the processing chamber 12 is set to a predetermined level by the operation of the gas exhaust unit 50. In the step ST2, the high frequency power from the first high frequency power supply 62 is supplied to the upper electrode 30 and the high frequency bias power from the second high frequency power supply 64 is supplied to the lower electrode LE.

The step ST2 is executed under the following condition.

Pressure in processing chamber: 50 mTorr (6.65 Pa) to 200 mTorr (26.6 Pa)

Processing gas $N_2$ gas: 200 sccm to 400 sccm $H_2$ gas: 200 sccm to 400 sccm

High frequency power for plasma generation: 500 W to 2000 W

High frequency bias power: 200 W to 500 W

In the step ST2, the plasma of the processing gas is generated and a portion of the organic film OL which is exposed through the opening of the anti-reflection film AL is etched. The resist mask RM is also etched. As a result, the resist mask RM is removed and the portion of the organic film OL which is exposed through the opening of the anti-reflection film AL is removed, as can be seen from FIG. 5. In other words, the pattern of the anti-reflection film AL is transferred onto the organic film OL and the organic film OL is formed to have a pattern providing an opening MO, thereby serving as a mask MK. In the step ST2, the operation of each component of the plasma processing apparatus 10 can be controlled by the control unit Cnt.

In the present embodiment, a step ST3 is executed after the step ST2. In the step ST3, the first region R1 is etched. The etching of the first region R1 is stopped immediately before the second region R2 is exposed. In other words, the first region R1 is etched until the first region R1 remains a little on the second region R2. To do so, in the step ST3, a processing gas is supplied into the processing chamber 12 from gas sources selected among the gas sources of the gas source group 40. This processing gas used in the step contains a fluorocarbon gas. Moreover, the processing gas may further include a rare gas, e.g., Ar gas. Further, the processing gas may further contain an oxygen gas. In the step ST3, a pressure in the processing chamber 12 is set to a predetermined level by the operation of the gas exhaust unit 50. In the step ST3, the high frequency power supply from the first high frequency power supply 62 is supplied to the upper electrode 30 and the high frequency bias power from the second high frequency power supply 64 is supplied to the lower electrode LE.

In the step ST3, the plasma of the processing gas is generated and a portion of the first region R1 which is exposed through the opening of the mask MK is etched by active species of fluorocarbon. The etching of the step ST3 is reactive ion etching. The processing time of the step ST3 is set such that the first region R1 of a predetermined film thickness remains on the second region R2 after the execution of the step ST3. By executing the step ST3, an upper opening UO is partially formed as can be seen from FIG. 6. The operation of each component of the plasma processing apparatus 10 can be controlled by the control unit Cnt.

In a step ST11 to be described later, the condition that realizes a deposition mode, i.e., a mode in which deposition of deposit containing fluorocarbon on the surface of the wafer W including the first region R1 dominates over the etching of the first region R1, is selected. On the other hand, in the step ST3, the condition that realizes an etching mode, i.e., a mode in which the etching of the first region R1 dominates over the deposition of deposit, is selected. To do so, in this example, the fluorocarbon gas used in the step ST3 may include at least one of $C_4F_8$ gas and $CF_4$ gas. A ratio of fluorine atoms to carbon atoms (i.e., the number of fluorine atoms/the number of carbon atoms) in the fluorocarbon gas used in the step ST3 is higher than that in the fluorocarbon gas used in the step ST11. In this example, in order to increase a degree of dissociation of the fluorocarbon gas, the high frequency power for plasma generation used in the step ST3 may be set to be greater than that used in the step ST11. Accordingly, the etching mode can be realized. Moreover, in this example, the high frequency bias power used in the step ST3 may be set to be greater than the high frequency bias power used in the step ST11. Accordingly, the energy of ions attracted to the wafer W can be increased, so that the first region R1 can be etched at a high speed.

The step ST3 is executed under the following condition.

Pressure in processing chamber: 10 mTorr (1.33 Pa) to 50 mTorr (6.65 Pa)

Processing gas $C_4F_8$ gas: 10 sccm to 30 sccm $CF_4$ gas: 50 sccm to 150 sccm

Ar gas: 500 sccm to 1000 sccm $O_2$ gas: 10 sccm to 30 sccm

High frequency power for plasma generation: 500 W to 2000 W

High frequency bias power: 500 W to 2000 W

Next, a step ST4 is executed. In the step ST4, a plasma of a processing gas containing an oxygen-containing gas is generated in the processing chamber 12. To do so, the processing gas is supplied into the processing chamber 12 from gas sources selected among the gas sources of the gas source group 40. In this example, this processing gas used in the step ST4 may contain oxygen gas as an oxygen-containing gas. Moreover, the processing gas may further include a rare gas (e.g., Ar gas) or an inert gas such as nitrogen gas. In the step ST4, a pressure in the processing chamber 12 is set to a predetermined level by the operation of the gas exhaust unit 50. In the step ST4, the high frequency power from the first high frequency power supply 62 is supplied to the upper electrode 30. In the step ST4, the high frequency bias power from the second high frequency power supply 64 may not be supplied to the lower electrode LE.

In the step ST4, active species of oxygen are generated. A width of an upper end portion of the opening MO of the mask MK is increased by the active species of oxygen. Specifically, an upper shoulder portion of the mask MK which defines the upper end portion of the opening MO is etched in a tapered shape as can be seen from FIG. 7. Accordingly, even if a deposit generated in the following steps is adhered to a surface defining the opening MO of the mask MK, the decrease in the width of the opening MO can be reduced. The operation of each component of the plasma processing apparatus 10 in the step ST4 can be controlled by the control unit Cnt.

In a step ST12 to be described later, the step ST13 is carried out to decrease a very small amount of deposit generated in each sequence, and there is a need to suppress excessive decrease of the deposit. On the other hand, the step ST4 is executed to increase the width of the upper end portion of the opening MO of the mask MK and the processing time of the step ST4 needs to be short.

The step ST4 is executed under the following condition.

Pressure in processing chamber: 30 mTorr (3.99 Pa) to 200 mTorr (26.6 Pa)

Processing gas $O_2$ gas: 50 sccm to 500 sccm

Ar gas: 200 sccm to 1500 sccm

High frequency power for plasma generation: 100 W to 500 W

High frequency bias power: 0 W to 200 W

By executing the above-described steps, the wafer W in a state before the sequence SQ1 is applied can be obtained. In such a wafer W, the first region R1 fills the recess formed by the second region R2 and covers the second region R2. Further, the mask MK is formed on the first region R1 and provides above the recess an opening with a width greater than a width of the recess. Next, in the method MT, sequence SQ1 is performed for the wafer W in the above state one or more times and, then, sequence SQ2 is performed one or more times. In the present embodiment, sequence SQ3 may be performed one or more times after sequence SQ2 is performed one or more times. The sequences SQ1 to SQ3 are performed to etch the first region R1. Each of the sequences SQ1 to SQ3 includes the steps ST11 to ST13. Hereinafter, the steps ST1 to ST3 commonly executed in all of the sequences SQ1 to SQ3 will be described in detail and, then, the difference between the sequences SQ1 to SQ3 will be described.

In each sequence, the step ST11 is first executed. In the step ST11, a plasma of a processing gas is generated in the processing chamber 12 where the wafer W is accommodated. To do so, in the step ST11, the processing gas is supplied into the processing chamber 12 from gas sources selected among the gas sources of the gas source group 40. This processing gas used in the step ST11 contains a fluorocarbon gas. The processing gas may further contain a rare gas, e.g., Ar gas. In the step ST11, a pressure in the processing chamber 12 is set to a predetermined level by the operation of the gas exhaust unit 50. In the step ST11, the high frequency power from the first high frequency power supply 62 is supplied to the upper electrode 30.

Figure 8:
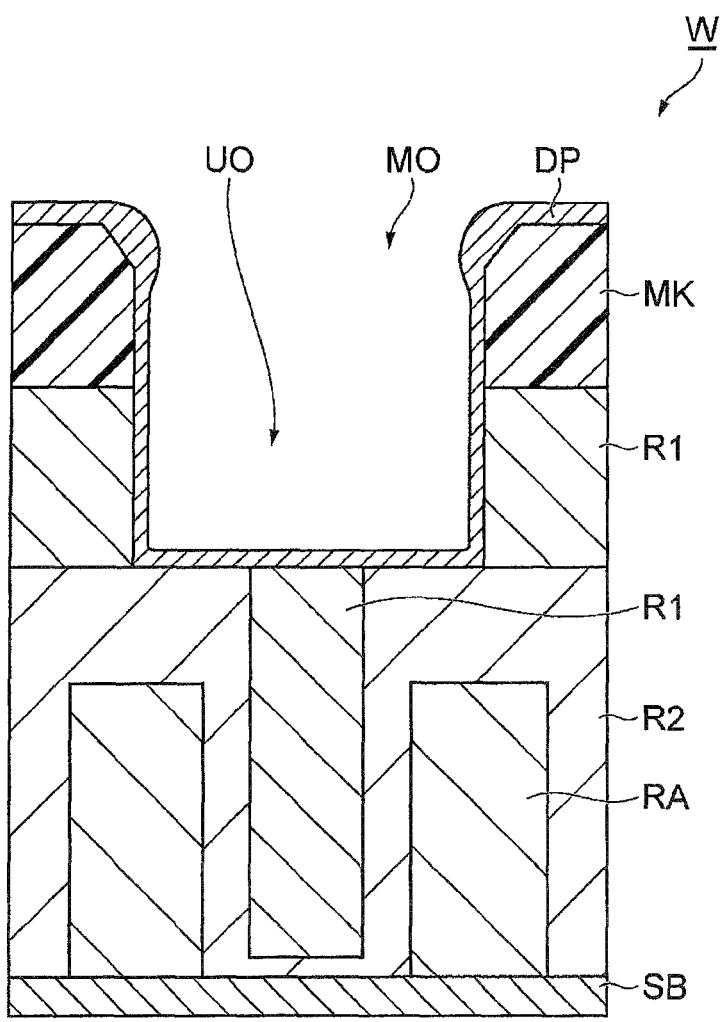
Figure 11:
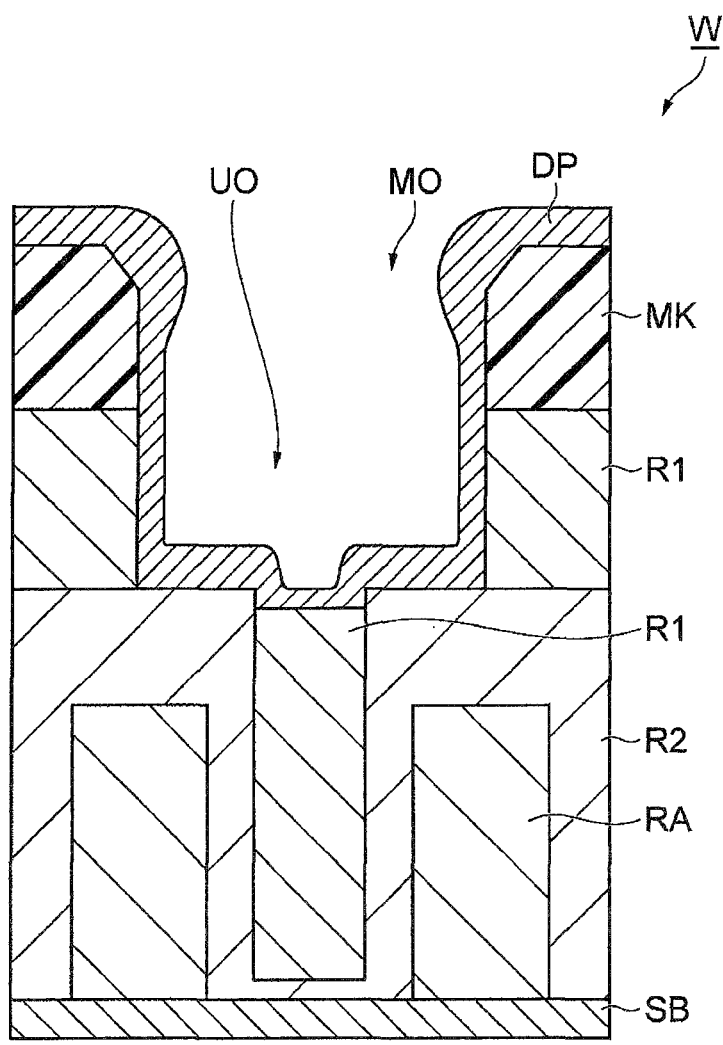
Figure 14:
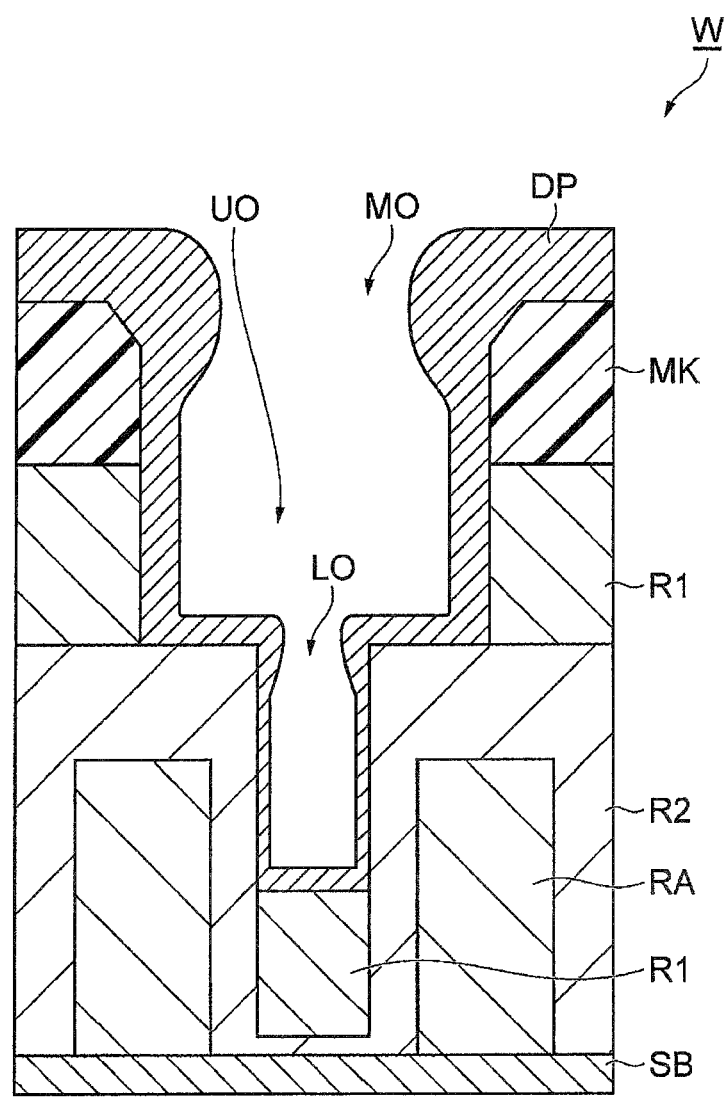

In the step ST11, the plasma of the processing gas containing a fluorocarbon gas is generated and dissociated fluorocarbon is deposited on the surface of the wafer W to form a deposit DP (see FIGS. 8, 11 and 14). The operation of each component of the plasma processing apparatus 10 in the step ST11 can be controlled by the control unit Cnt.

As described above, in the step ST11, the condition that realizes the deposition mode is selected. In this example, $C_4F_6$ gas is used as the fluorocarbon gas.

The step ST11 is executed under the following condition.

Pressure in processing chamber: 10 mTorr (1.33 Pa) to 50 mTorr (6.65 Pa)

Processing gas $C_4F_6$ gas: 2 sccm to 10 sccm

Ar gas: 500 sccm to 1500 sccm

High frequency power for plasma generation: 100 W to 500 W

High frequency bias power: 0 W

In each sequence of the present embodiment, the step ST12 is executed. In the step ST12, a plasma of a processing gas containing an oxygen-containing gas and an inert gas is generated in the processing chamber 12. To do so, in the step ST12, the processing gas is supplied into the processing chamber 12 from gas sources selected among the gas sources of the gas source group 40. In this example, this processing gas used in the step ST12 contains oxygen gas as the oxygen-containing gas. Further, in this example, the processing gas used in the step ST12 contains, as the inert gas, a rare gas such as Ar gas. The inert gas may be nitrogen gas. In the step ST12, a pressure in the processing chamber 12 is set to a predetermined level by the operation of the gas exhaust unit 50. In the step ST12, the high frequency power from the first high frequency power supply 62 is supplied to the upper electrode 30. In the step ST12, the high frequency bias power from the second high frequency power supply 64 may not be supplied to the lower electrode LE.

Figure 9:
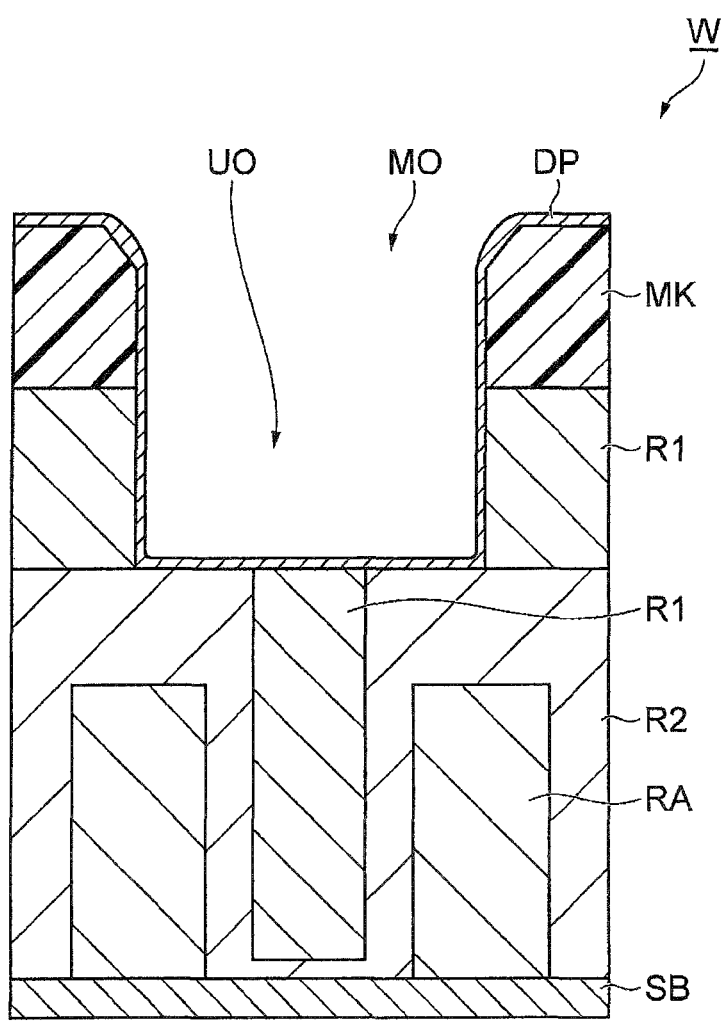
Figure 10:
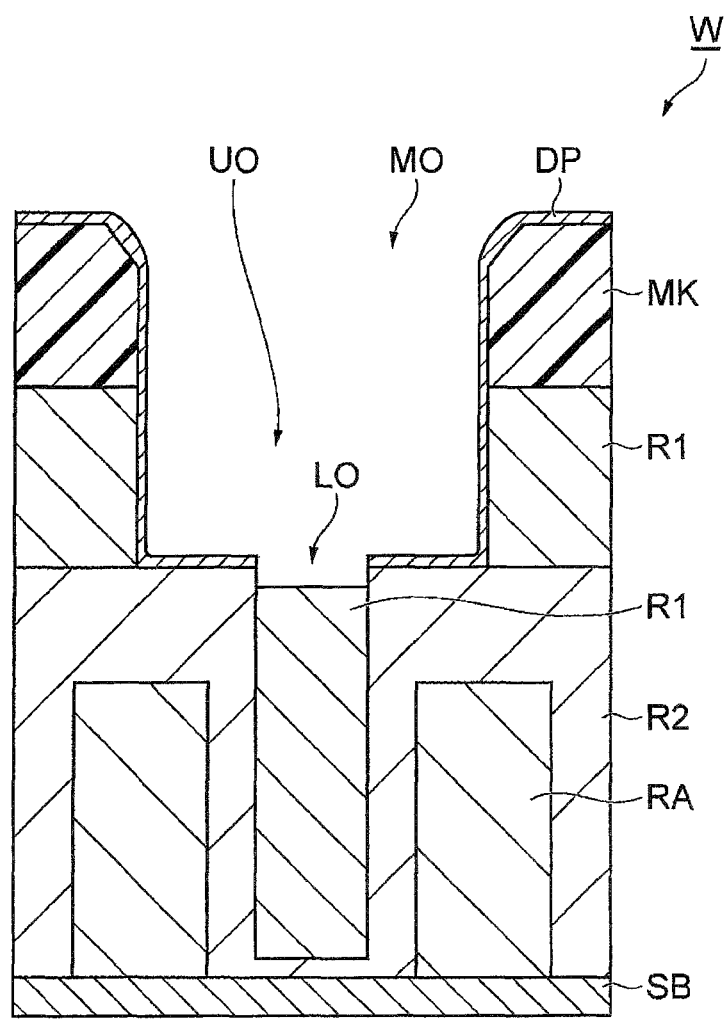
Figure 12:
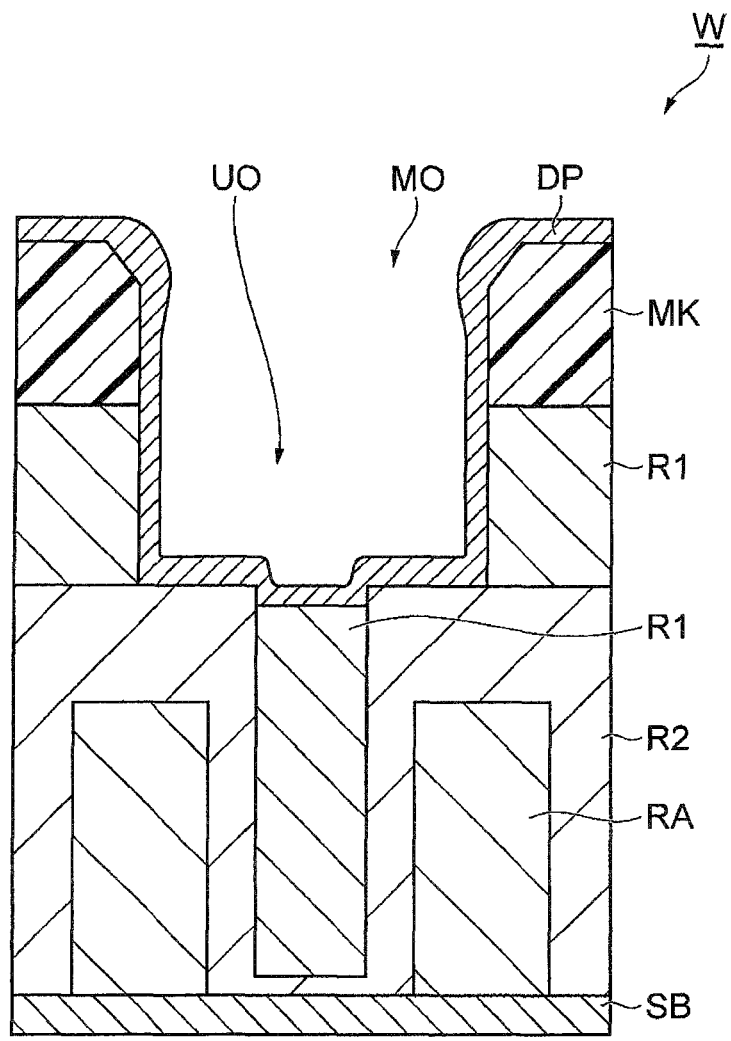
Figure 13:
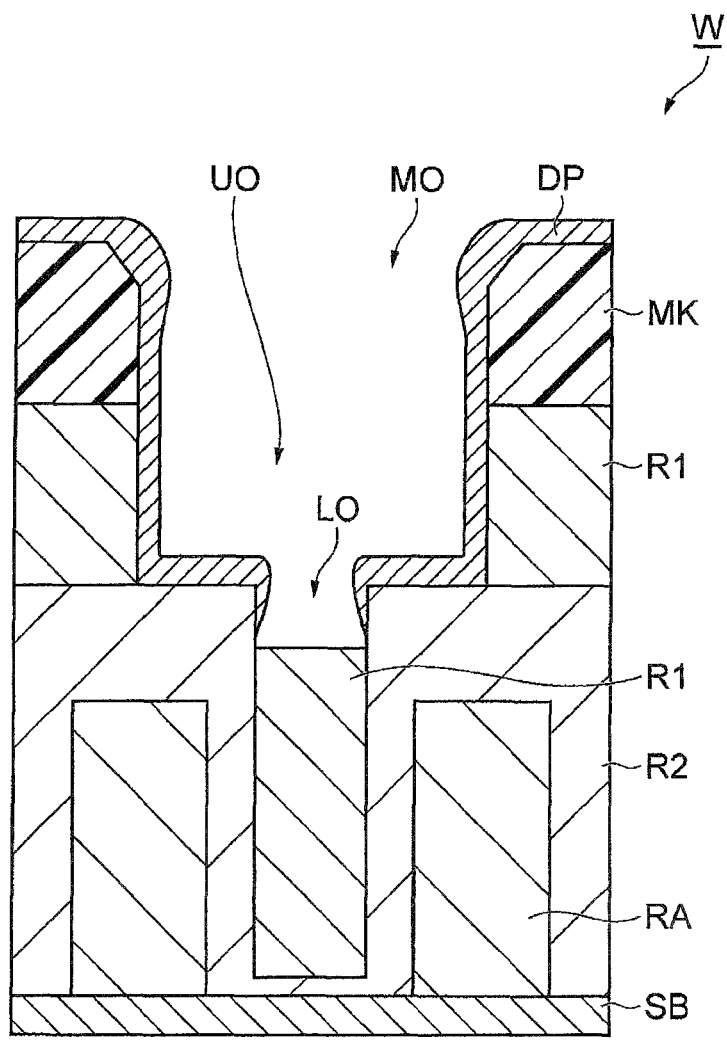
Figure 15:
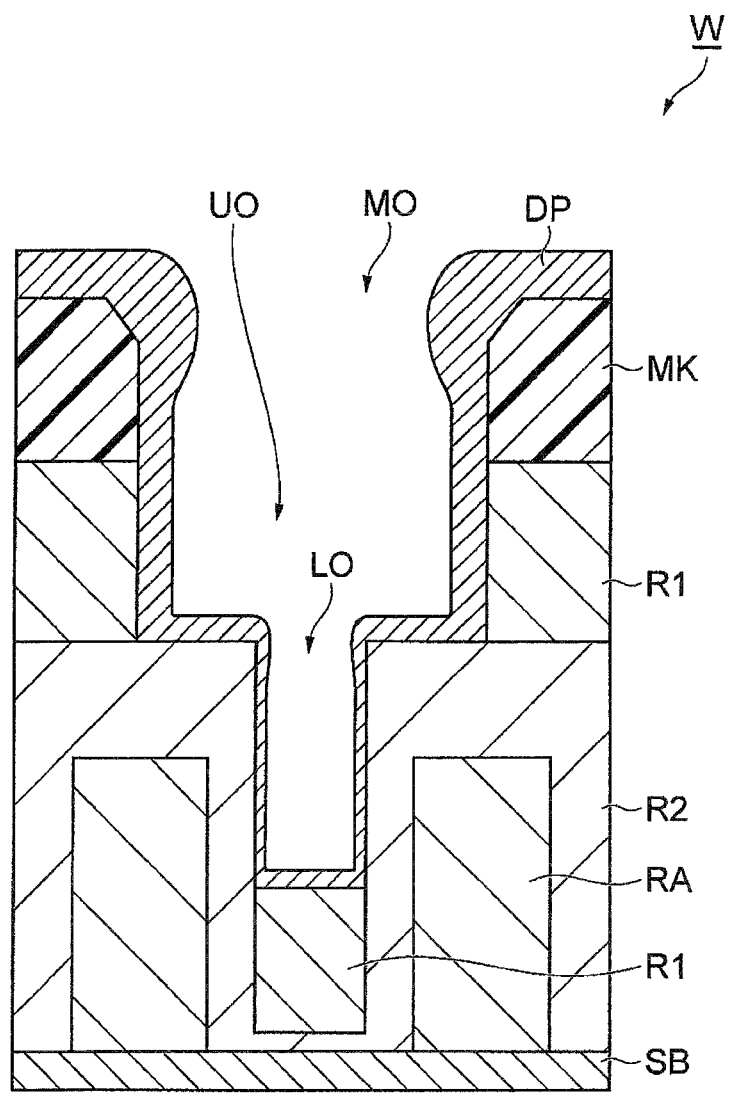
Figure 16:
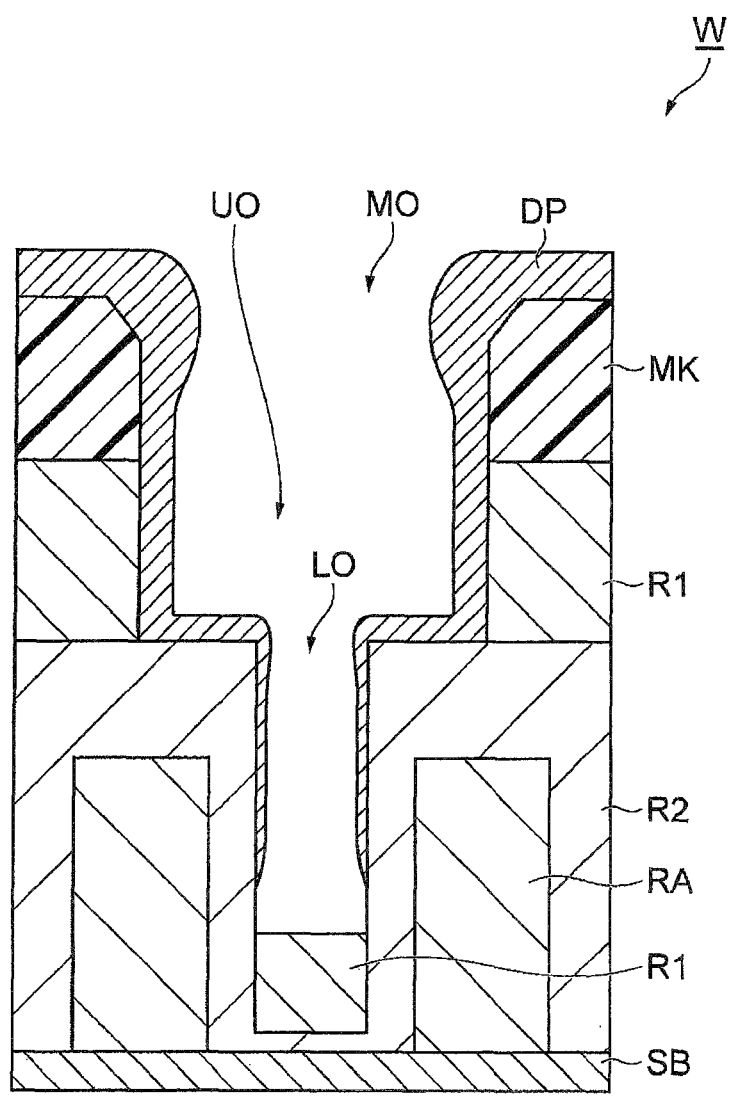

In the step ST12, active species of oxygen are generated and the amount of deposit DP on the wafer W is appropriately decreased by the active species of oxygen (see FIGS. 9, 12 and 15). As a result, the opening MO and the upper opening UO are prevented from being blocked by an excessive amount of deposit DP. In the case of the processing gas used in the step ST12, the oxygen gas is diluted with the inert gas and, thus, excessive removal of the deposit DP can be suppressed. The operation of each component of the plasma processing apparatus 10 in the step ST12 can be controlled by the control unit Cnt.

The step ST12 is executed under the following condition.

Pressure in processing chamber: 10 mTorr (1.33 Pa) to 50 mTorr (6.65 Pa)

Processing gas $O_2$ gas: 2 sccm to 20 sccm

Ar gas: 500 sccm to 1500 sccm

High frequency power for plasma generation: 100 W to 500 W

High frequency bias power: 0 W

In the present embodiment, the step ST12 of each sequence, i.e., a single step ST12, is executed for two or more seconds. In the step ST12, the deposit DP can be etched at a rate of about 1 nm/sec or less. In the case of executing the sequence by using the plasma processing apparatus 10, it is required to switch gases when the steps ST11 to ST13 are shifted from one to another. Therefore, the step ST12 needs to be executed for two or more seconds in consideration of time required for stabilization of discharge. However, if the etching rate of the deposit DP in the step ST12 is too high, the deposit for protecting the second region R2 may be excessively removed. Thus, the deposit DP is etched at a rate of about 1 nm/sec or less to suppress the excessive removal of the deposit DP in the step ST12. As a consequence, it is possible to appropriately control the amount of the deposit DP on the wafer W. The etching rate of the deposit DP which is about 1 nm/sec or less in the step ST12 can be realized by selecting a pressure in the processing chamber, a degree of dilution of oxygen in the processing gas with a rare gas, i.e., an oxygen concentration, and a high frequency power for plasma generation from the above-described condition.

In each sequence, a step ST13 is executed thereafter. In the step ST13, the first region R1 is etched. To do so, in the step ST13, the processing gas is supplied into the processing chamber 12 from gas sources selected among the gas sources of the gas source group 40. This processing gas used in the step ST13 contains an inert gas. In this example, the inert gas may be a rare gas such as Ar gas. Or, the inert gas may be nitrogen gas. In the step ST13, a pressure in the processing chamber 12 is set to a predetermined level by the operation of the gas exhaust unit 50. In the step ST13, the high frequency power from the first high frequency power supply 62 is supplied to the upper electrode 30. In the step ST13, the high frequency bias power from the second high frequency power supply 64 is supplied to the lower electrode LE.

The step ST13 is executed under the following condition.

Pressure in processing chamber: 10 mTorr (1.33 Pa) to 50 mTorr (6.65 Pa)

Processing gas

Ar gas: 500 sccm to 1500 sccm

High frequency power for plasma generation: 100 W to 500 W

High frequency bias power: 20 W to 300 W

In the step ST13, a plasma of an inert gas is generated and ions are attracted to the wafer W. The first region R1 is etched by radicals of fluorocarbon contained in the deposit DP (see FIGS. 10, 13 and 16). The operation of each component of the plasma processing apparatus 10 in the step ST13 can be controlled by the control unit Cnt.

In the method MT, the sequence SQ1 is performed during a period including time when the second region R2 is exposed. In the step ST11 of the sequence SQ1, the deposit DP is formed on the wafer W as can be seen from FIG. 8. FIG. 8 shows the state in which the second region R2 is exposed by the progress of the etching of the first region R1 and the deposit DP is formed on the second region R2. The deposit DP protects the second region R2. In the step ST12 of the sequence SQ1, the amount of deposit DP formed in the step ST11 is decreased as can be seen from FIG. 9. In the step ST13 of the sequence SQ1, the first region R1 is etched by radicals of fluorocarbon contained in the deposit DP. The sequence SQ1 enables the second region R2 to be exposed and the first region R1 in the recess formed by the second region R2 to be etched in a state where the second region R2 is protected by the deposit DP. Accordingly, the lower opening LO is gradually formed as can be seen from FIG. 10.

The sequence SQ1 is repeated one or more times. Therefore, after the execution of the step ST13, it is determined in the step STa whether or not a stop condition is satisfied, as can be seen from FIG. 1A. When the sequence SQ1 has been performed a predetermined number of times, it is determined that the stop condition is satisfied. When it is determined in the step STa that the stop condition is not satisfied, the sequence SQ1 is performed again from the step ST11. On the other hand, when it is determined in the step STa that the stop condition is satisfied, the sequence SQ2 is performed.

In the step ST11 of the sequence SQ2, the deposit DP is formed on the wafer W as can be seen from FIG. 11. In the step ST12 of the sequence SQ2, the amount of the deposit DP formed in the step ST11 is decreased as can be seen from FIG. 12. In the step ST13 of the sequence SQ2, the first region R1 is etched by radicals of fluorocarbon contained in the deposit DP. The sequence SQ2 enables the first region R1 in the recess formed by the second region R2 to be further etched in a state where the second region R2 is protected by the deposit DP. Accordingly, the depth of the lower opening LO is further increased as can be seen from FIG. 13.

The sequence SQ2 is repeated one or more times. Therefore, after the execution of the step ST13, it is determined in the step STb whether or not the stop condition is satisfied, as can be seen from FIG. 1B. When the sequence SQ2 has been performed a predetermined number of times, it is determined that the stop condition is satisfied. When it is determined in the step STb that the stop condition is not satisfied, the sequence SQ2 is performed again from the step ST11. On the other hand, when it is determined in the step STb that the stop condition is satisfied, the execution of the sequence SQ2 is completed.

In the method MT, the processing condition of the sequence SQ1 is set such that an etching amount of the first region R1 in the sequence SQ1 is smaller than that of the first region R1 in the sequence SQ2. In this example, the execution time of the sequence SQ1 is set to be shorter than that of the sequence SQ2. In this example, a ratio of the execution time of the steps ST11, ST12 and ST13 in the sequence SQ1 may be set to be equal to that of the steps ST11, ST12 and ST13 in the sequence SQ2. For example, in the sequence SQ1, the execution time of the step ST11 is selected from a range of 2 sec to 5 sec; the execution time of the step ST12 is selected from a range of 2 sec to 5 sec; and the execution time of the step ST13 is selected from a range of 5 sec to 10 sec. In the sequence SQ2, the execution time of the step ST11 is selected from a range of sec to 10 sec; the execution time of the step ST12 is selected from a range of 2 sec to 10 sec; and the execution time of the step ST13 is selected from a range of 5 sec to 20 sec.

Although the active species of fluorocarbon generated in the step ST11 are deposited on the second region R2 to protect the second region R2, the second region R2 may be etched when the second region R2 is exposed by the etching of the first region R1. Therefore, in the method MT, the sequence SQ1 is performed one or more times during a period in which the second region R2 is exposed. Accordingly, the deposit DP is formed on the wafer W while decreasing the etching amount and the second region R2 is protected by the deposit DP. Then, the sequence SQ2 in which the etching amount is larger is executed one or more times. As a result, the method MT enables the first region R1 to be etched while suppressing the etching of the second region R2.

Since the deposit DP is already formed on the second region R2 in the sequence SQ1, the etching of the second region R2 can be suppressed even if the etching amount in the sequence SQ2 is increased. By setting an etching amount in the sequence SQ2 to be greater than that in the sequence SQ1, the etching rate of the first region R1 can be improved.

In the method MT of the present embodiment, a sequence SQ3 is performed after the sequence SQ2. In the step ST11 of the sequence SQ3, the deposit DP is formed on the wafer W as can be seen from FIG. 14. In the step ST12 of the sequence SQ3, the amount of the deposit DP formed in the step ST11 is decreased as can be seen from FIG. 15. In the step ST13 of the sequence SQ3, the first region R1 is etched by radicals of fluorocarbon contained in the deposit DP. By performing the sequence SQ3, the first region R1 in the recess formed by the second region R2 is further etched in a state where the second region R2 is protected by the deposit DP. Accordingly, the depth of the lower opening LO is further increased, and ultimately, the first region R1 is etched until the second region R2 is exposed at the bottom portion of the recess, as can be seen from FIG. 16.

The sequence SQ3 is performed one or more times. Therefore, after the execution of the step ST13, it is determined in the step STc whether or not a stop condition is satisfied, as can be seen from FIG. 1B. When the sequence SQ3 has been performed a predetermined number of times, it is determined that the stop condition is satisfied. When it is determined in the step STc that the stop condition is not satisfied, the sequence SQ3 is performed again from the step ST11. On the other hand, when it is determined in the step STc that the stop condition is satisfied, the execution of the method MT is completed.

In the step ST13 of the sequence SQ3, the high frequency bias power is set to be greater than the high frequency bias power used in the step ST13 of the sequence SQ1 and the sequence SQ2. For example, in the step ST13 of the sequence SQ1 and the sequence SQ2, the high frequency bias power is set within a range from 20 W to 100 W. In the step ST13 of the sequence SQ3, the high frequency bias power is set within a range from 100 W to 300 W. In the sequence SQ3, the execution time of the step ST11 is selected from a range of 2 sec to 10 sec; the execution time of the step ST12 is selected from a range of 2 sec to 10 sec; and the execution time of the step ST13 is selected from a range of 5 sec to 15 sec.

As can be seen from FIG. 14, the amount of the deposit DP on the wafer W is considerably increased after the sequences SQ1 and SQ2. When the amount of the deposit DP is increased, the width of the opening MO, the width of the upper opening UO, and the width of the lower opening LO are decreased by the deposit DP. Accordingly, the flow velocity of ions may not be enough to reach the deep portion of the lower opening LO. Since, however, a relatively large high frequency bias power is used in the step ST13 of the sequence SQ3, the energy of ions attracted to the wafer W can be increased. As a result, even if the lower opening LO has a large depth, ions can reach the deep portion of the lower opening LO.

Figure 17:
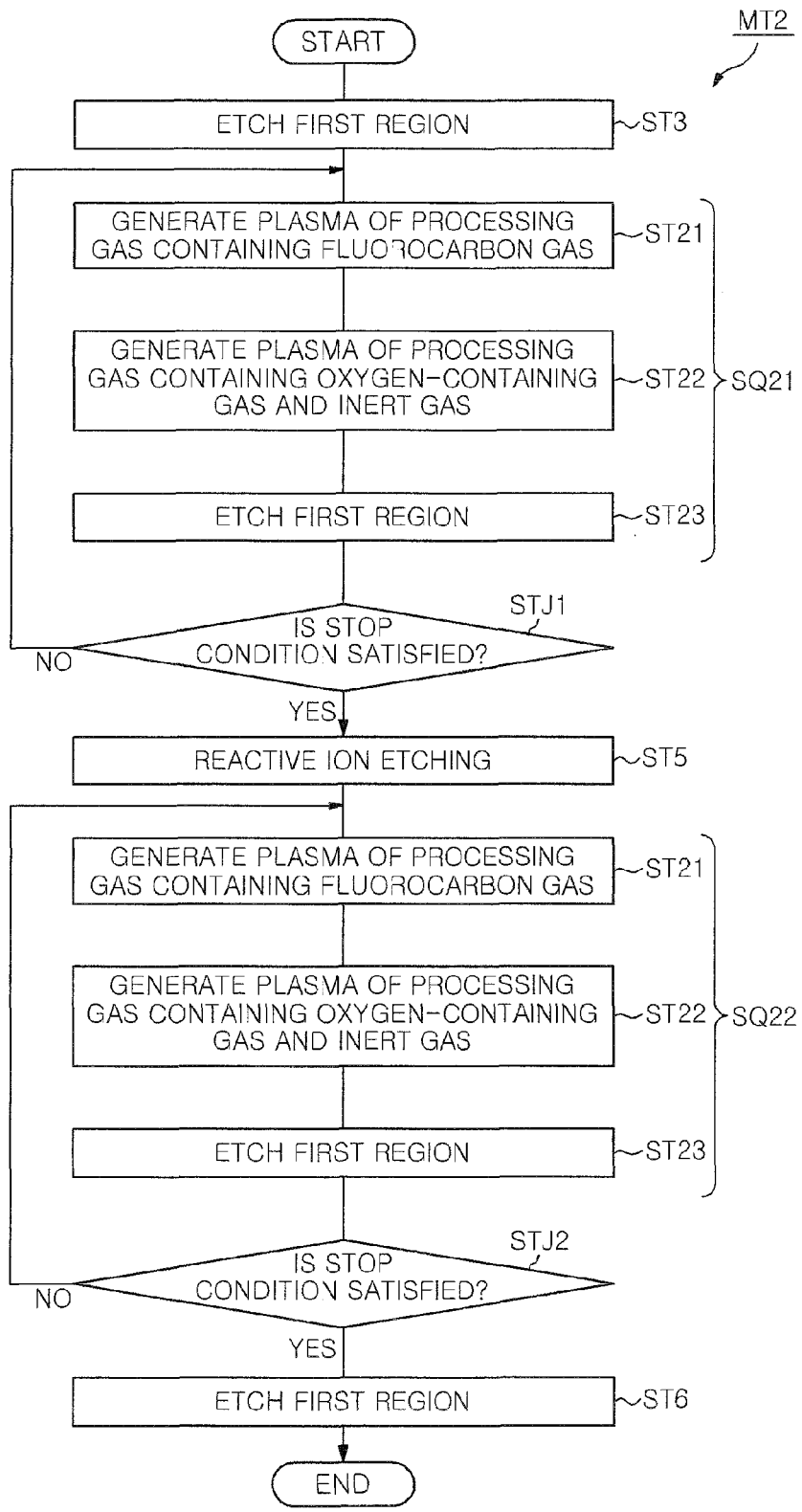
FIG. 17 is a flowchart of an etching method according to another embodiment.

Hereinafter, an etching method according to another embodiment will be described. FIG. 17 is a flowchart of the etching method according to another embodiment. In a method MT2 shown in FIG. 17, a first region of silicon oxide in a target object is selectively etched with respect to a second region of silicon nitride in the target object by performing plasma processing on the target object. The method MT2 includes a sequence SQ21 and a sequence SQ22 which are each performed one or more times, and a step ST6. The method MT2 may further include the step ST3 as in the case of the method MT. The method MT2 may further include the step ST5.

Figure 18:
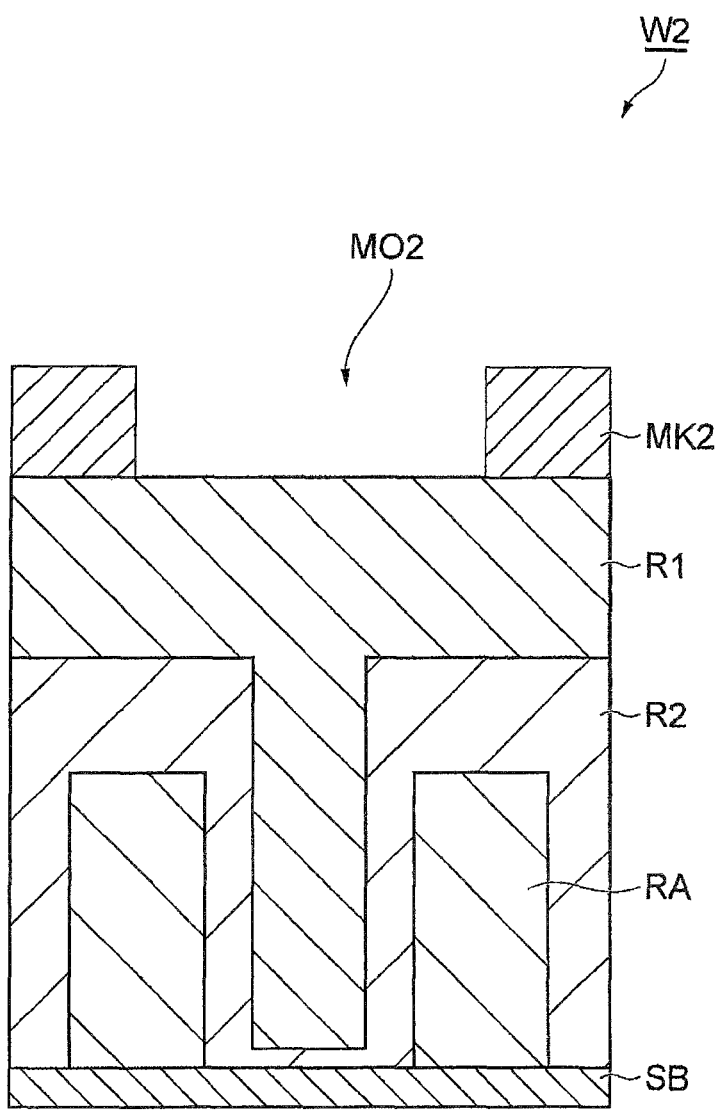
FIG. 18 is a cross sectional view showing an example of a target object to which the method shown in FIG. 17 is applied.

FIG. 18 is a cross sectional view showing an example of the target object to which the method MT2 shown in FIG. 17 is applied. In an initial state where the method MT2 is not applied, the target object (hereinafter, referred to as "wafer W2") includes the substrate SB, the first region R1, and the second region R2 as shown in FIG. 18, as in the case of the above-described wafer W. The wafer W2 may further include a protruding region RA as in the case of the above-described wafer W. The wafer W2 further includes a mask MK2 on the first region R1. The mask MK2 provides, above a recess formed by the second region R2, an opening MO2 having a width greater than that of the recess.

The mask MK2 may be made of a material that is selected to allow the first region R1 to be selectively etched. For example, the mask MK2 may be made of an organic film, as in the case of the mask MK of the wafer W. When the mask MK2 is made of an organic film, the target object to which the method MT2 is applied may include the resist mask RM, the anti-reflection film AL, and the organic film OL, as in the case of the wafer W shown in FIG. 2. In order to obtain the mask MK2 made of the organic film OL, the method MT2 may further include the steps ST1, ST2 and ST4, as in the case of the method MT.

Or, the mask MK2 may contain a metal. For example, the mask MK2 may be made of a material such as TiN. In that case, the mask MK2 may be formed by providing another mask on a metal layer and transferring a pattern of the another mask onto the metal layer by plasma etching.

Figure 25:
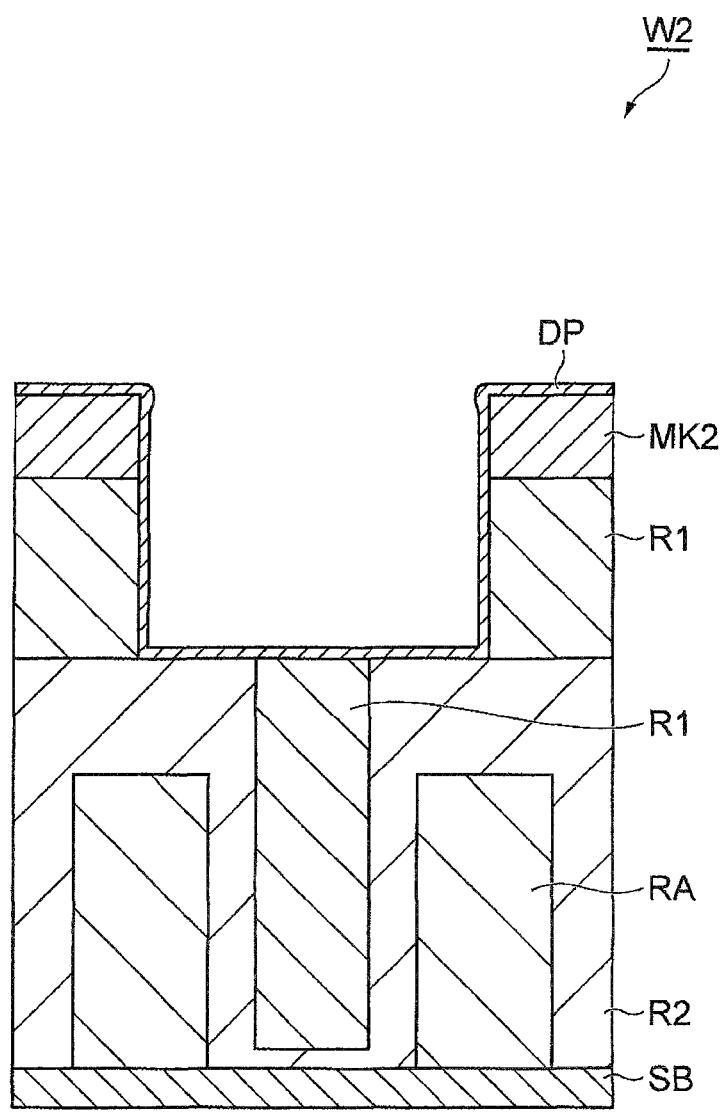
Figure 26:
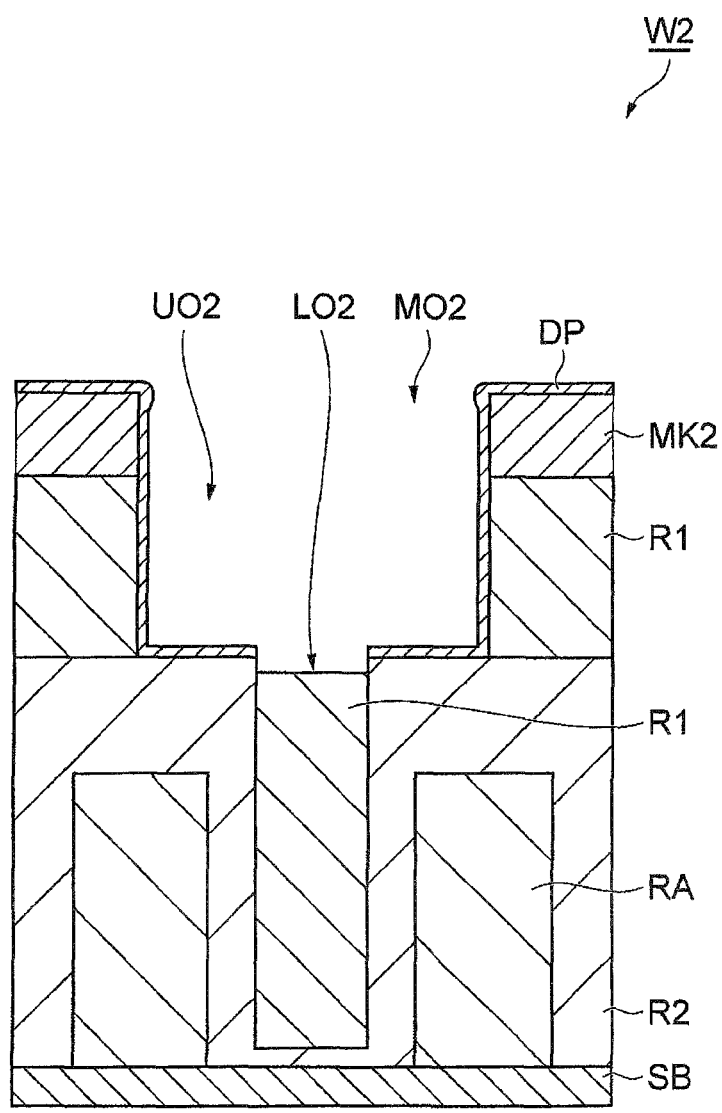
Figure 27:
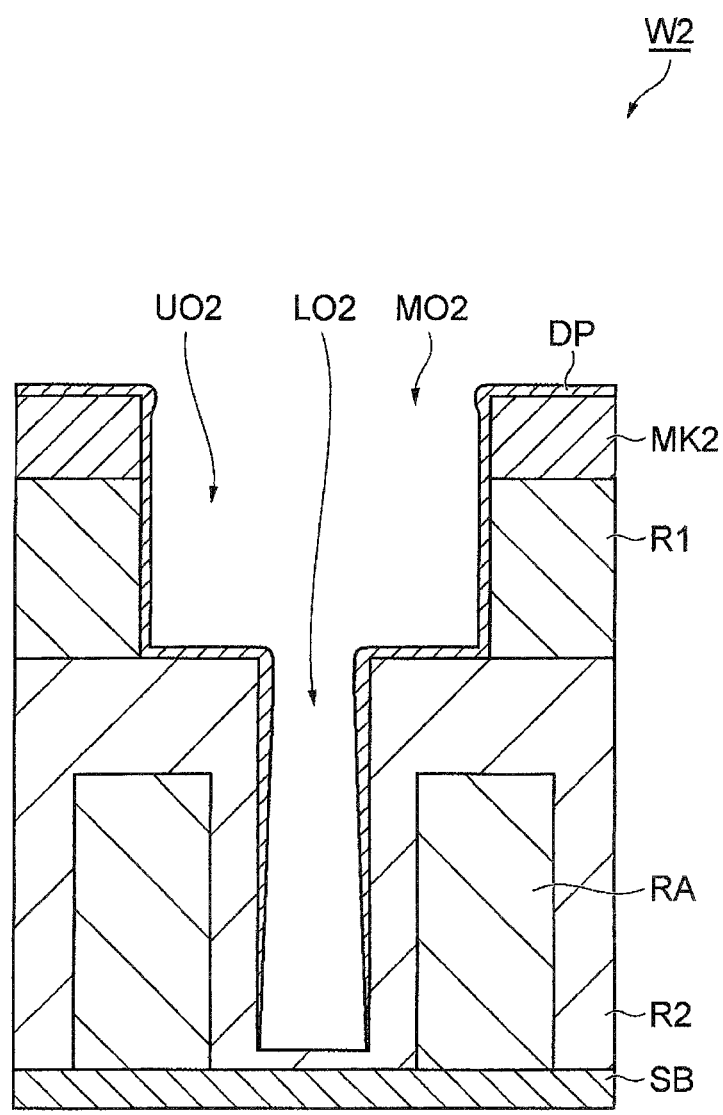
FIG. 27 is a cross sectional view showing the target object after the steps of the method shown in FIG. 17 are completed.
Figure 28:
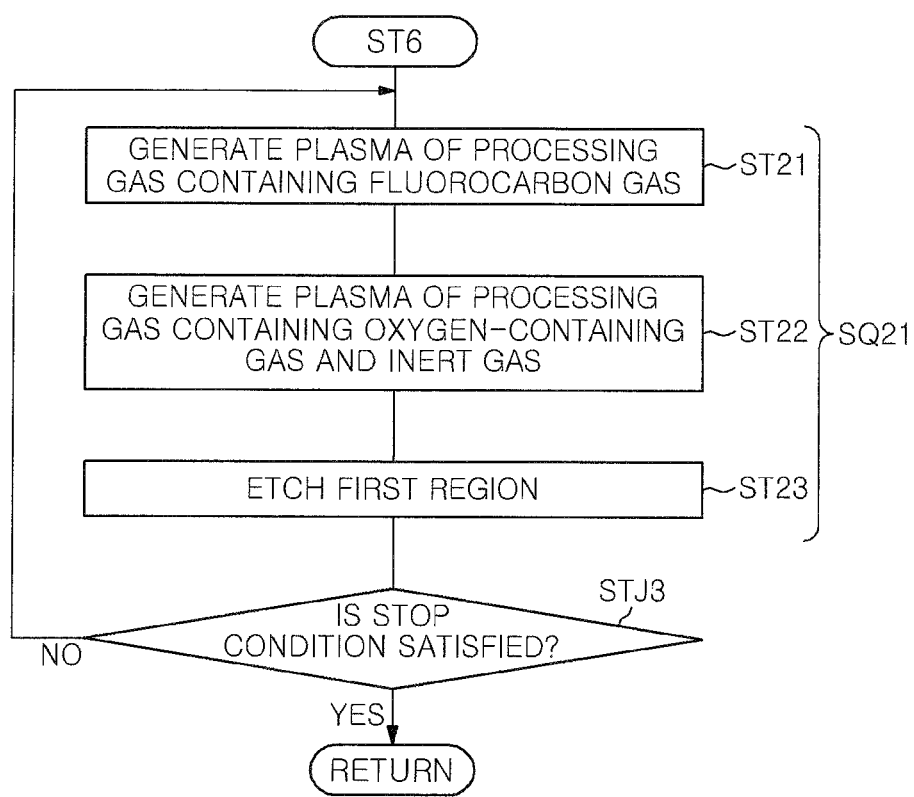
FIG. 28 is a flowchart of a step ST6 shown in FIG. 17.

Hereinafter, the method MT2 will be described in detail with reference to FIG. 17. In the following description, FIGS. 18 and 19 to 27 will be referred to in addition to FIG. 17. FIGS. 19 to 26 are cross sectional views showing the target object in the respective steps of the method shown in FIG. 17. FIG. 27 is a cross sectional view showing the target object after the method shown in FIG. 17 is performed. FIG. 28 is a flowchart of a process that may be used in the step ST6 shown in FIG. 17. In the following description, an example in which the wafer W shown in FIG. 18 is processed by a single plasma processing apparatus 10 shown in FIG. 3 by using the method MT2 will be described. When the respective steps to be described below are executed, the respective components of the plasma processing apparatus 10 are controlled by the control unit Cnt.

Figure 19:
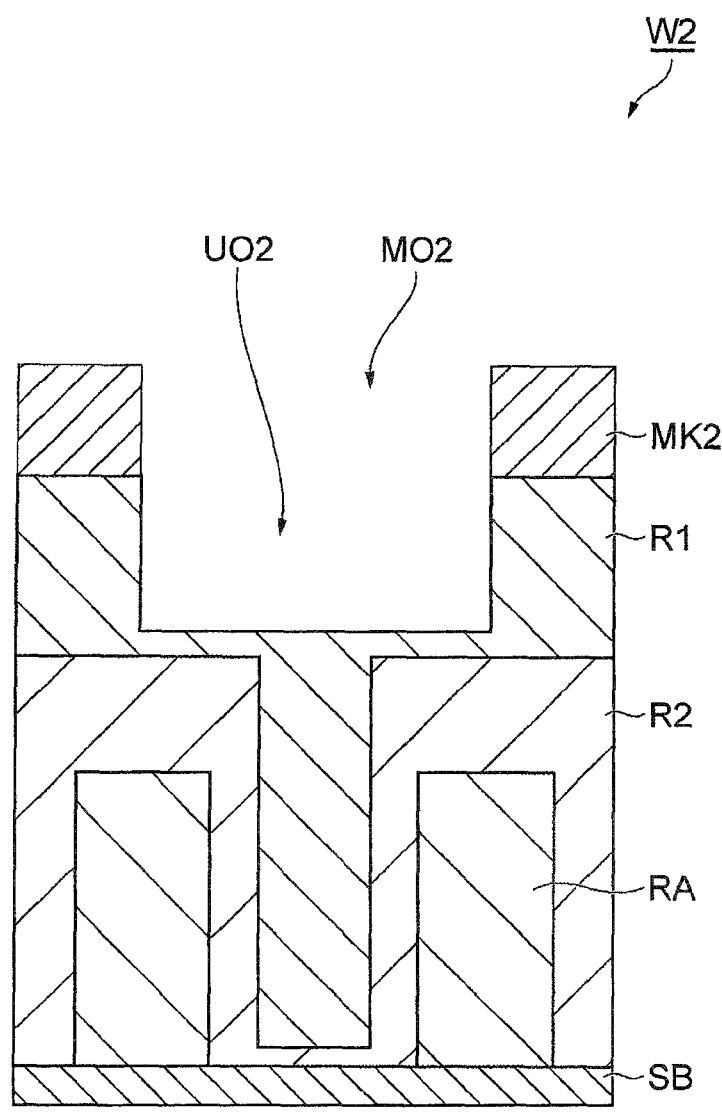
FIGS. 19 to 26 are cross sectional views showing the target object in respective steps of the etching method shown in FIG. 17.

In the method MT2, the wafer W2 shown in FIG. 18 is mounted and held on the mounting table PD. Next, the step ST3 of the method MT2 is executed. The step ST3 of the method MT2 is the same as the step ST3 of the method MT, i.e., a step of performing reactive ion etching on the first region R1. By executing the step ST3, a portion of the first region R1 which is exposed through the opening of the mask MK is etched by active species of fluorocarbon. A processing time of the step ST3 is set such that the first region R1 of a predetermined thickness remains on the second region R2 after the step ST3 is completed. By executing the step ST3, an upper opening UO2 is partially formed as shown in FIG. 19.

Next, in the method MT2, sequence SQ21 is performed one or more times to etch the first region R1. Sequence ST21 includes a step ST21 and a step ST23. Sequence SQ21 may further include a step ST22.

Figure 20:
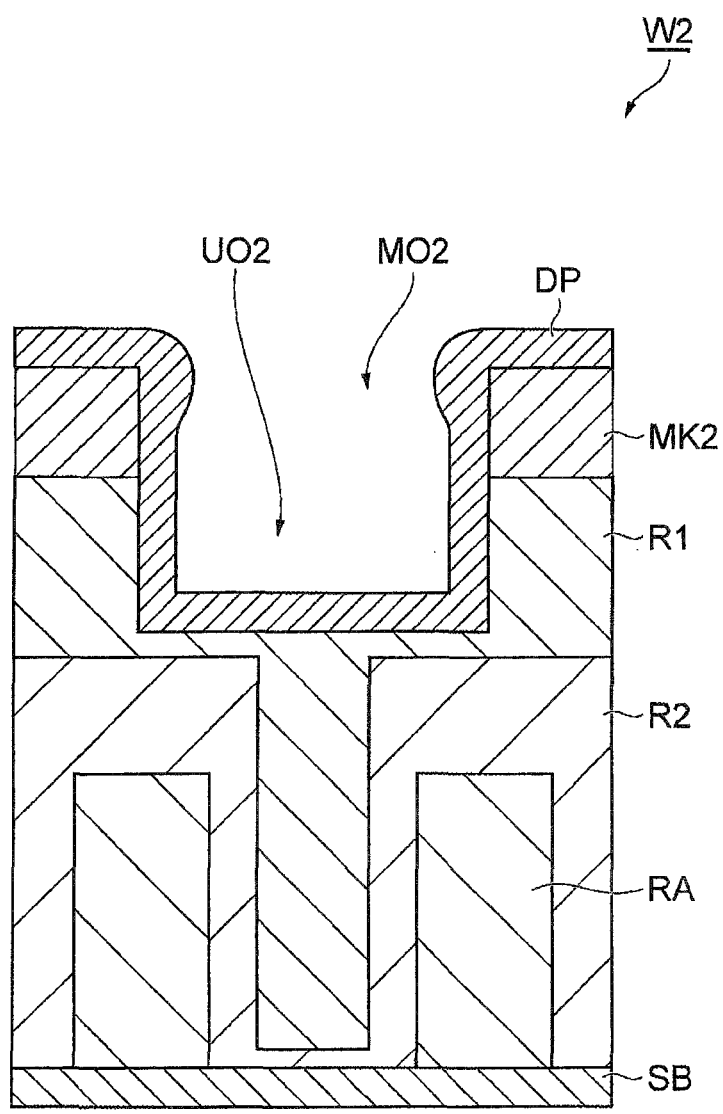

The step ST21 of the sequence SQ21 is the same as the step ST11. In the step ST21 of the sequence SQ21, a plasma of a processing gas containing a fluorocarbon gas is generated and dissociated fluorocarbon is deposited on the surface of the wafer W to forma deposit DP as shown in FIG. 20.

The step ST21 of the sequence SQ21 is executed under the following condition.

Pressure in processing chamber: 10 mTorr (1.33 Pa) to 50 mTorr (6.65 Pa)

Processing gas $C_4F_6$ gas: 3 sccm to 5 sccm

Ar gas: 700 sccm to 1200 sccm

High frequency power for plasma generation: 100 W to 500 W

High frequency bias power: 0 W

Processing time: 0.5 sec

Figure 21:
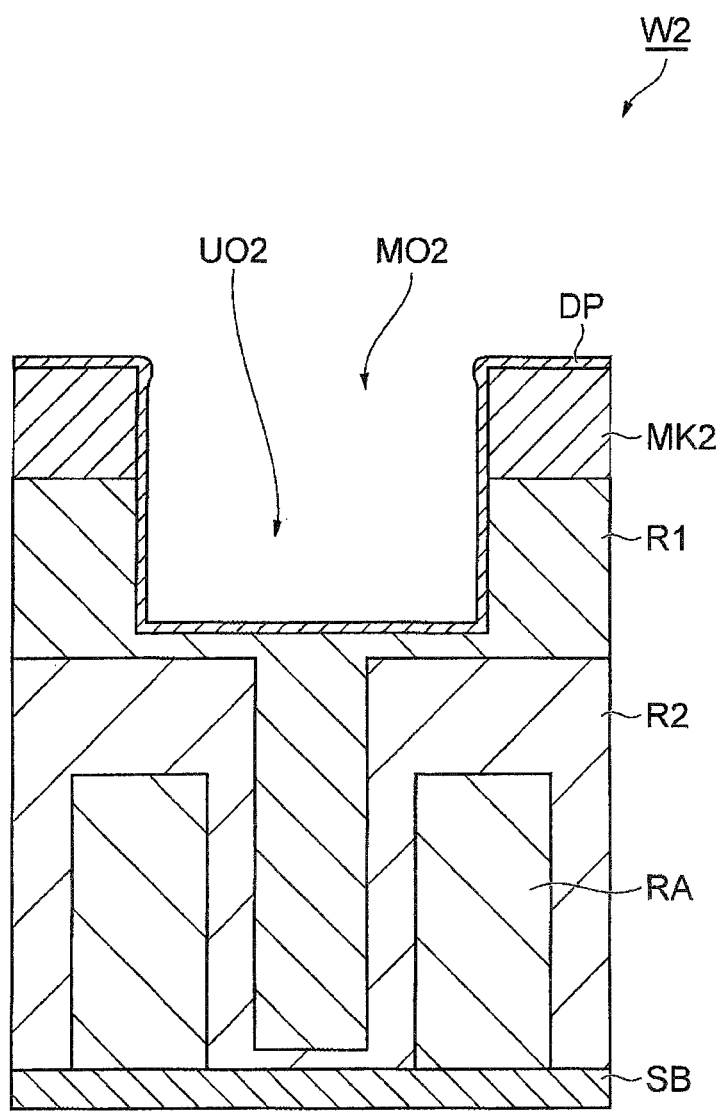

Next, the step ST22 of the sequence SQ21 is executed. The step ST22 of the sequence SQ21 is the same as the step ST12. In the step ST22 of the sequence SQ21, active species of oxygen are generated and the amount of the deposit DP on the wafer W2 is appropriately decreased by the active species of oxygen as shown in FIG. 21. As a result, it is possible to prevent the opening MO2 and the upper opening UO2 from being blocked by an excessive deposit DP. In the processing gas used in the step ST22 of the sequence SQ21, the oxygen gas is diluted by the inert gas and, thus, the excessive removal of the deposit DP can be suppressed.

The step ST22 of the sequence SQ21 is executed under the following condition.

Pressure in processing chamber: 10 mTorr (1.33 Pa) to 50 mTorr (6.65 Pa)

Processing gas $O_2$ gas: 4 sccm to 6 sccm

Ar gas: 700 sccm to 1200 sccm

High frequency power for plasma generation: 100 W to 500 W

High frequency bias power: 0 W

Processing time: 1 sec

Figure 22:
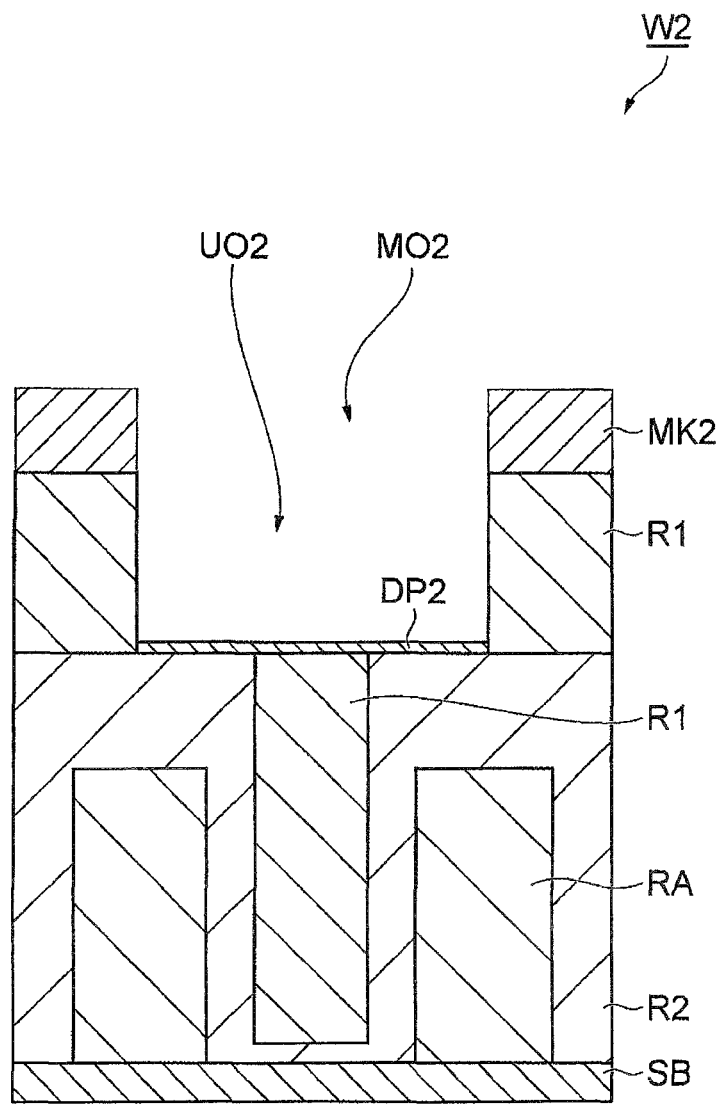

Next, the step ST23 of the sequence SQ21 is executed. The step ST23 of the sequence SQ21 is the same as the step ST13. In the step ST23 of the sequence SQ21, a plasma of an inert gas is generated and ions are attracted to the wafer W2. The first region R1 is etched by radicals of fluorocarbon contained in the deposit DP as shown in FIG. 22. As a result, the upper opening UO2 is formed.

The step ST23 of the sequence SQ21 is executed under the following condition.

Pressure in processing chamber: 10 mTorr (1.33 Pa) to 50 mTorr (6.65 Pa)
Processing gas
Ar gas: 700 sccm to 1200 sccm
High frequency power for plasma generation: 100 W to 500 W
High frequency bias power: 0 W to 20 W In the sequence SQ21, a ratio of the execution time of the step ST23 to the execution time of the step ST21 is set to be greater than a ratio of the execution time of the step ST23 to the execution time of the step ST21 in the sequence SQ22 to be described later. For example, the execution time of the step ST21 of the sequence SQ21 may be set to be equal to that of the step ST21 of the sequence SQ22, and the execution time of the step ST23 of the sequence SQ21 may be set to be longer than that of the step ST23 of the sequence SQ22. For example, the execution time of the step ST23 of the sequence SQ21 may be set to 7 seconds and the execution time of the step ST23 of the sequence SQ22 may be set to 5 seconds.

When the execution time of the step ST23 is shorter than that of the step ST21 in each sequence, the amount of the deposit DP formed on the wafer W2 is increased and the etching amount is decreased. On the other hand, when the execution time of the step ST23 is longer than that of the step ST21 in each sequence, the amount of the deposit DP formed on the wafer W2 is decreased and the etching amount is increased. Therefore, in the sequence SQ21, the amount of the deposit DP formed on the wafer W2 is relatively decreased and the etching amount is relatively increased. Accordingly, by performing the sequence SQ21 one or more times, the first region R1 can be etched while suppressing the blocking of the opening formed on the wafer W2 by the deposit DP.

Next, in a step STJ1 of the method MT2, it is determined whether or not stop condition is satisfied. It is determined that the stop condition is satisfied when the sequence SQ21 has been performed a predetermined number of times. When it is determined in the step STJ1 that the stop conditions are not satisfied, the sequence SQ21 is performed again from the step ST21. On the other hand, when it is determined in the step STJ1 that the stop condition is satisfied, the execution of the sequence SQ21 is completed.

As described above, in the sequence SQ21, the amount of the deposit DP is relatively decreased and the etching amount is relatively increased. As a result, the mask MK2 as well as the first region R1 are etched and a deposit DP2 including the material of the mask MK2 may be formed on the wafer W2 as shown in FIG. 22. In order to remove the deposit DP2, a step ST5 of the method MT2 is executed. In the step ST5, reactive ion etching is performed on the wafer W2 shown in FIG. 22.

Figure 23:
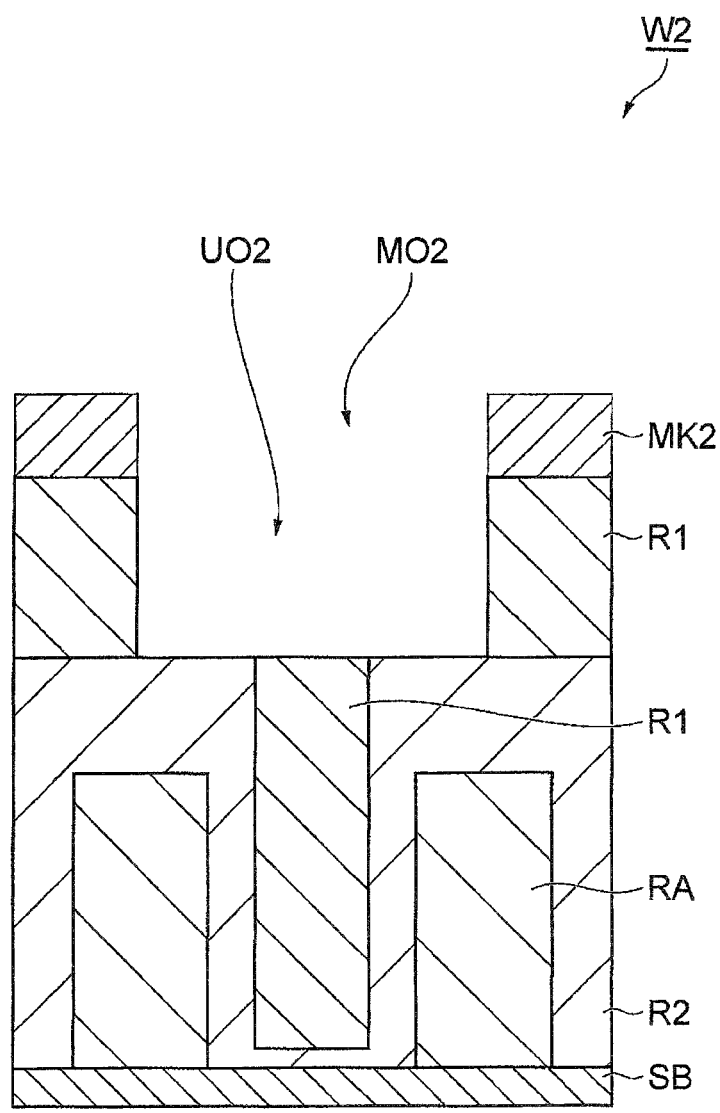

In the step ST5, a processing gas is supplied into the processing chamber 12 from gas sources selected among a plurality of gas sources of the gas source group 40. This processing gas used in the step ST5 is appropriately selected depending on a material forming the deposit DP2. For example, the processing gas contains a fluorocarbon gas. The processing gas may further contain a rare gas, e.g., Ar gas. The processing gas may further contain an oxygen gas. Further, in the step ST5, the gas exhaust unit 50 is driven to set a pressure in the processing chamber 12 to a predetermined level. Moreover, in the step ST5, the high frequency power from the first high frequency power supply is supplied to the upper electrode 30 and the high frequency bias power from the second high frequency power supply 64 is supplied to the lower electrode LE. In the step ST5, a plasma of the processing gas is generated and the deposit DP2 is etched by ions. Accordingly, the deposit DP2 that would hinder the etching of the first region R1 is removed as shown in FIG. 23. By executing the step ST5, an opening (lower opening LO2 to be described later) having an appropriate shape can be formed in subsequent processes of the method MT2.

The step ST5 is executed under the following condition.
Pressure in processing chamber: 10 mTorr (1.33 Pa) to 50 mTorr (6.65 Pa)
Processing gas
$C_4F_6$ gas: 4 sccm to 6 sccm
Ar gas: 700 sccm to 1200 sccm
$O_2$ gas: 3 sccm to 5 sccm
High frequency power for plasma generation: 100 W to 500 W
High frequency bias power: 40 W to 60 W
Processing time: 55 sec Next, the sequence SQ22 of the method MT2 is performed one or more times in order to etch the first region R1. The sequence SQ22 includes the step ST21 and the step ST23. The sequence SQ22 may further include the step ST22.

Figure 24:
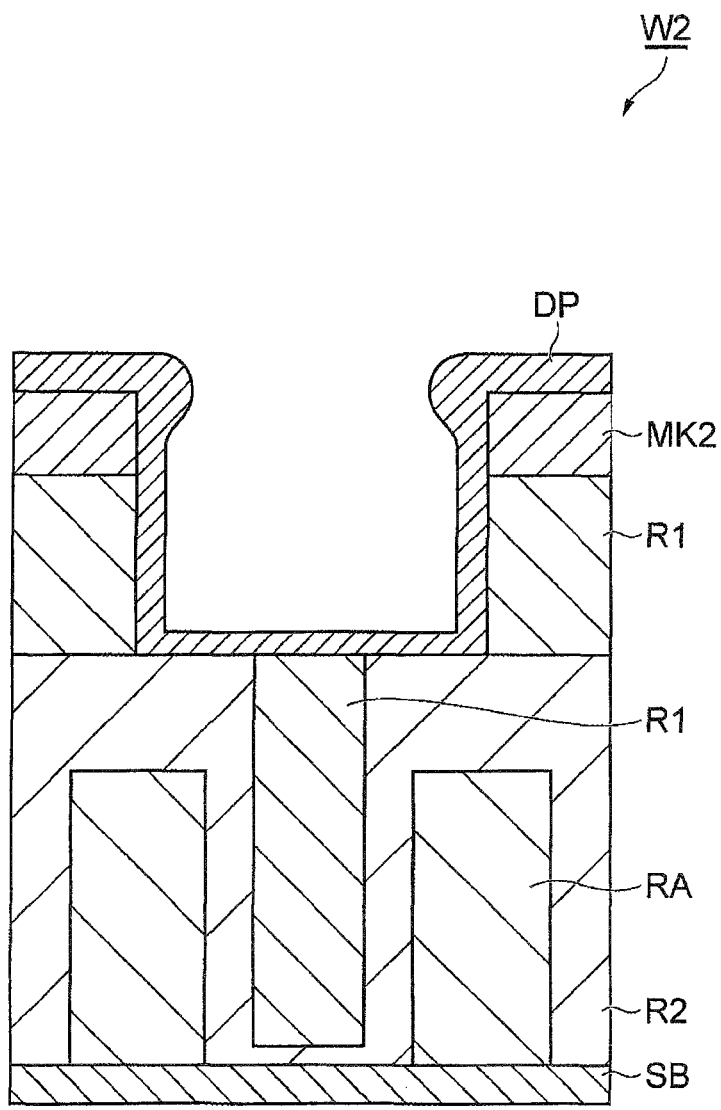

The step ST21 of the sequence SQ22 is the same as the step ST21 of the sequence SQ21. In the step ST21 of the sequence SQ22, a plasma of a processing gas containing a fluorocarbon gas is generated and dissociated fluorocarbon is deposited on the surface of the wafer W to form a deposit DP as shown in FIG. 24.

Next, the step ST22 of the sequence SQ22 is executed. The step ST22 of the sequence SQ22 is the same as the step ST22 of the sequence ST21. In the step ST22 of the sequence SQ22, active species of oxygen are generated and the amount of the deposit DP on the wafer W2 is appropriately decreased by the active species of oxygen as shown in FIG. 25.

Next, the step ST23 of the sequence SQ22 is executed. The step ST23 of the sequence SQ22 is the same as the step ST23 of the sequence SQ21. In the step ST23 of the sequence SQ22, a plasma of an inert gas is generated and ions are attracted to the wafer W2. Further, the first region R1 is etched by radicals of fluorocarbon contained in the deposit DP. Accordingly, the first region R1 in the recess formed by the second region R2 is etched. As a result, the lower opening LO2 is partially formed as shown in FIG. 26.

In the sequence SQ22, a ratio of the execution time of the step ST23 to the execution time of the step ST21 is set to be smaller than a ratio of the execution time of the step ST23 to the execution time of the step ST21 of the sequence SQ21. Therefore, in the sequence SQ22, the amount of the deposit DP is relatively increased and the etching amount is relatively decreased. By performing the sequence SQ22 one or more times, the second region R2 can be protected by the deposit DP when silicon oxide of the first region R1 covering the surface of the second region R2 is removed (see FIG. 26).

Next, in a step STJ2 of the method MT2 it is determined whether or not stop condition is satisfied. It is determined that the stop condition is satisfied when the sequence SQ22 has been performed a predetermined number of times. When it is determined in the step STJ2 that the stop conditions are not satisfied, the sequence SQ22 is performed again from the step ST21. On the other hand, when it is determined in the step STJ2 that the stop condition is satisfied, the execution of the sequence SQ22 is completed.

Next, a step ST6 of the method MT2 is executed in order to further etch the first region R1. In the step ST6 of one example, reactive ion etching is performed on the first region R1. The step ST6 may be the same as the step ST3 of the method MT2. When the step ST6 is executed, the second region R2 is protected by the deposit DP formed by the sequence SQ22. Therefore, in the step ST6, the first region R1 can be etched at a high etching rate while suppressing the etching of the second region R2. By executing the step ST6, the depth of the lower opening LO2 is further increased as shown in FIG. 27. The first region R1 is etched until the second region R2 is exposed at the bottom portion of the recess.

In the step ST6 of another example, sequence SQ23 is performed one or more times as shown in FIG. 28. The sequence SQ23 includes the step ST21 and the step ST23, as in the case of the sequences SQ21 and SQ22. The sequence SQ23 may further include the step ST22, as in the case of the sequences SQ21 and SQ22.

In the step ST21 of the sequence SQ23, a plasma of a processing gas containing a fluorocarbon gas is generated and dissociated fluorocarbon is deposited on the surface of the wafer W to form a deposit DP. In the step ST22 of the sequence SQ23, active species of oxygen are generated and the amount of the deposit DP on the wafer W2 is appropriately decreased by the active species of oxygen. In the step ST23 of the sequence SQ23, a plasma of an inert gas is generated and ions are attracted to the wafer W2. Further, the first region R1 is etched by radicals of fluorocarbon contained in the deposit DP.

In the sequence SQ23, a ratio of the execution time of the step ST23 to the execution time of the step ST21 is set to be greater than a ratio of the execution time of the step ST23 to the execution time of the step ST21 of the sequence SQ22. For example, the execution time of the step ST21 of the sequence SQ23 may be set to be equal to the execution time of the step ST21 of the sequence SQ21, and the execution of the step ST23 of the sequence SQ23 may be set to be longer than the execution time of the step ST21 of the sequence SQ22. Therefore, in the sequence SQ23, the amount of the deposit DP is relatively decreased and the etching amount is relatively increased. Accordingly, the first region R1 can be etched without blocking the lower opening LO2, the upper opening UO2, and the opening MO2 of the mask MK2. Since the deposit DP is formed already on the second region R2 by performing the sequence SQ22 one or more times, the first region R1 can be etched at a high etching rate in a state where the second region R2 is protected by the deposit DP in the sequence SQ23.

While various embodiments have been described, the disclosure may be variously modified without being limited to the above-described embodiments. For example, in the methods MT and MT2, the high frequency power for plasma generation is supplied to the upper electrode 30. However, the high frequency power may be supplied to the lower electrode LE. Further, in the methods MT and MT2, a plasma processing apparatus other than the plasma processing apparatus 10 may be employed. Specifically, the methods MT and MT2 can be performed by any plasma processing apparatus such as an inductively coupled plasma processing apparatus or a plasma processing apparatus for generating a plasma by using a surface wave such as a microwave.

In at least one or all of the sequences SQ1 to SQ3, the execution order of the steps ST11 to ST13 may be changed. For example, the step ST12 may be executed after the step ST13 in at least one or all of the sequences SQ1 to SQ3. Further, in at least one or all of the sequences SQ21 to SQ23, the execution order of the steps ST21 to ST23 may be changed. For example, the step ST22 may be executed after the step ST23 in at least one or all of the sequences SQ21 to SQ23.

While the disclosure has been shown and described with respect to the embodiments, it will be understood by those skilled in the art that various changes and modifications may be made without departing from the scope of the disclosure as defined in the following claims.

What is claimed is:

1. An etching method for selectively etching a first region of silicon oxide with respect to a second region of silicon nitride by performing plasma processing on a target object including the second region forming a recess, the first region that fills the recess and covers the second region, and a mask that is formed on the first region and provides, above the recess, an opening having a width greater than a width of the recess, the etching method comprising:

(A) performing a first sequence one or more times to etch the first region; and
    (B) after the step (A), performing a second sequence one or more times to further etch the first region,
    wherein each of the first sequence and the second sequence includes:
    (a) generating a plasma of a processing gas containing a fluorocarbon gas in a processing chamber where the target object is accommodated and forming a deposit containing fluorocarbon on the target object; and
    (b) etching the first region by radicals of fluorocarbon contained in the deposit while said generating the plasma of the processing gas containing the fluorocarbon gas is stopped,
    wherein the first sequence is performed during a period including time when the second region is exposed, and
    wherein an etching amount of the first region in the first sequence is smaller than an etching amount of the first region in the second sequence.

2. The etching method of claim 1, further comprising step (C) after the step (B), wherein step (C) includes performing a third sequence which is performed one or more times to further etch the first region,
    wherein the third sequence includes the step (a) and the step (b),
    wherein in the step (b) of each of the first to the third sequences, a plasma of an inert gas is generated and ions are attracted to the target object by supplying a high frequency bias power to a mounting table on which the target object is mounted, and
    wherein the high frequency bias power used in the step (b) of the third sequence is higher than the high frequency bias power used in the step (b) of the first and the second sequence.

3. The etching method of claim 2, wherein each of the first to the third sequences further include: (c) generating a plasma of a processing gas containing an oxygen-containing gas and an inert gas in the processing chamber where the target object is accommodated.

4. An etching method for selectively etching a first region of silicon oxide in a target object with respect to a second region of silicon nitride in the target object, the target object including, in an initial state where the method is not applied, the second region forming a recess, the first region that fills the recess and covers the second region, and a mask that is formed on the first region and provides, above the recess, an opening having a width greater than a width of the recess, the etching method comprising:

(A) performing a first sequence one or more times to etch the first region;

(B) after the step (A), performing a second sequence one or more times to further etch the first region; and (C) further etching the first region after the step (B), wherein each of the first sequence and the second sequence includes:

(a) generating a plasma of a processing gas containing a fluorocarbon gas and forming a deposit containing fluorocarbon on the target object; and (b) etching the first region by radicals of fluorocarbon contained in the deposit, wherein a ratio of an execution time of the step (b) in the first sequence to an execution time of the step (a) in the first sequence is greater than a ratio of an execution time of the step (b) in the second sequence to an execution time of the step (a) in the second sequence.

5. The etching method of claim 4, wherein the step (C) includes etching the first region by reactive ion etching.

6. The etching method of claim 5, where each of the first and the second sequence further includes (c) generating a plasma of a processing gas containing an oxygen-containing gas and an inert gas and decreasing the deposit containing fluorocarbon.

7. The etching method of claim 4, wherein the step (C) includes performing a third sequence including the step (a) and the step (b) one or more times, wherein a ratio of an execution time of the step (b) in the third sequence to an execution of the step (a) in the third sequence is greater than a ratio of an execution time of the step (b) in the second sequence to an execution of the step (a) in the second sequence.

8. The etching method of claim 7, wherein each of the first to the third sequence further includes: (c) generating a plasma of a processing gas containing an oxygen-containing gas and an inert gas and decreasing the deposit containing fluorocarbon.

9. The etching method of claim 4, further comprising, between the step (A) and the step (B), (D) performing reactive ion etching on a deposit containing a material forming the mask and formed on the target object.

10. The etching method of claim 9, wherein the step (C) includes etching the first region by reactive ion etching.

11. The etching method of claim 10, where each of the first and the second sequence further includes (c) generating a plasma of a processing gas containing an oxygen-containing gas and an inert gas and decreasing the deposit containing fluorocarbon.

12. The etching method of claim 9, wherein the step (C) includes performing a third sequence including the step (a) and the step (b) one or more times, wherein a ratio of an execution time of the step (b) in the third sequence to an execution of the step (a) in the third sequence is greater than a ratio of an execution time of the step (b) in the second sequence to an execution of the step (a) in the second sequence.

13. The etching method of claim 12, wherein each of the first to the third sequence further includes: (c) generating a plasma of a processing gas containing an oxygen-containing gas and an inert gas and decreasing the deposit containing fluorocarbon.

* * * * *